US012231056B2

(12) United States Patent
Telefus

(10) Patent No.: US 12,231,056 B2
(45) Date of Patent: Feb. 18, 2025

(54) INTEGRATED ENERGY SUPPLY SYSTEM AND METHODS TO PROVIDE REGULATED AC AND LOW VOLTAGE DC

(71) Applicant: INTELESOL, LLC, Dublin, CA (US)

(72) Inventor: Mark Telefus, Orinda, CA (US)

( * ) Notice: Subject to any disclaimer, the term of this patent is extended or adjusted under 35 U.S.C. 154(b) by 287 days.

(21) Appl. No.: 17/930,597

(22) Filed: Sep. 8, 2022

(65) Prior Publication Data

US 2022/0416681 A1 Dec. 29, 2022

Related U.S. Application Data

(63) Continuation-in-part of application No. PCT/US2020/044930, filed on Aug. 5, 2020, and a continuation-in-part of application No. PCT/US2020/042896, filed on Jul. 21, 2020.

(60) Provisional application No. 62/987,045, filed on Mar. 9, 2020.

(51) Int. Cl.
| | |
|---|---|
| *H02M 7/217* | (2006.01) |
| *H02M 1/00* | (2006.01) |
| *H02P 29/00* | (2016.01) |
| *H05B 45/10* | (2020.01) |
| *H05B 45/3725* | (2020.01) |
| *H05B 45/50* | (2022.01) |

(52) U.S. Cl.
CPC ......... *H02M 7/217* (2013.01); *H02M 1/0006* (2021.05); *H02M 1/0067* (2021.05); *H02P 29/00* (2013.01); *H05B 45/10* (2020.01); *H05B 45/3725* (2020.01); *H05B 45/50* (2020.01)

(58) Field of Classification Search
CPC ... H02M 1/0067; H02M 1/0006; H02M 7/217
See application file for complete search history.

(56) References Cited

U.S. PATENT DOCUMENTS

| | | | |
|---|---|---|---|
| 4,074,345 | A | 2/1978 | Ackermann |
| 4,127,895 | A | 11/1978 | Krueger |
| 4,466,071 | A | 8/1984 | Russell, Jr. |
| 4,581,540 | A | 4/1986 | Guajardo |
| 4,631,625 | A | 12/1986 | Alexander et al. |
| 4,760,293 | A | 7/1988 | Hebenstreit |
| 4,812,995 | A | 3/1989 | Girgis et al. |
| 5,121,282 | A | 6/1992 | White |
| 5,371,646 | A | 12/1994 | Biegelmeier |
| 5,654,880 | A | 8/1997 | Brkovic et al. |
| 5,796,274 | A | 8/1998 | Willis et al. |
| 5,801,933 | A | 9/1998 | Ravid |

(Continued)

OTHER PUBLICATIONS

Eguchi et al, Design of a Charge-Pump Type AC-DC Converter for RF-ID Tags, 2006 International Symposium on Communications and Information Technologies, F4D—3, IEEE (2006).

(Continued)

*Primary Examiner* — Adolf D Berhane
*Assistant Examiner* — Jye-June Lee

(57) ABSTRACT

Both AC and DC Power supply systems that may be connected directly to. AC mains and are integrated on silicon are described. The AC systems include both simple on/off capabilities as well as phase control capabilities. The DC power supply may be fixed, adjustable as through a potentiometer and programmable. The power supply systems use newly invented components of AC/DC converters and bidirectional MOSFET switches.

6 Claims, 41 Drawing Sheets

(56) References Cited

U.S. PATENT DOCUMENTS

| | | | |
|---|---|---|---|
| 5,933,305 A | 8/1999 | Schmaltz et al. | |
| 6,081,123 A | 6/2000 | Kasbarian et al. | |
| 6,111,494 A | 8/2000 | Fischer | |
| 6,141,197 A | 10/2000 | Xu | |
| 6,169,391 B1 | 1/2001 | Lei | |
| 6,188,203 B1 | 2/2001 | Rice et al. | |
| 6,538,906 B1 | 3/2003 | Ke et al. | |
| 6,813,720 B2 | 11/2004 | Leblanc | |
| 6,839,208 B2 | 1/2005 | Macbeth et al. | |
| 6,984,988 B2 | 1/2006 | Yamamoto | |
| 7,053,626 B2 | 5/2006 | Monter et al. | |
| 7,110,225 B1 | 9/2006 | Hick | |
| 7,164,238 B2 | 1/2007 | Kazanov et al. | |
| 7,319,574 B2 | 1/2008 | Engel | |
| 7,586,285 B2 | 9/2009 | Gunji | |
| 7,596,004 B2 | 9/2009 | Grbovic | |
| 7,693,670 B2 | 4/2010 | Durling et al. | |
| 7,729,147 B1 | 6/2010 | Wong et al. | |
| 7,746,677 B2 | 6/2010 | Unkrich | |
| 7,948,719 B2 | 5/2011 | Xu | |
| 8,374,729 B2 | 2/2013 | Chapel et al. | |
| 8,463,453 B2 | 6/2013 | Parsons, Jr. | |
| 8,560,134 B1 | 10/2013 | Lee | |
| 8,717,720 B2 | 5/2014 | Deboer | |
| 8,817,441 B2 | 8/2014 | Callanan | |
| 8,947,838 B2 | 2/2015 | Yamai et al. | |
| 9,287,792 B2 | 3/2016 | Telefus et al. | |
| 9,577,420 B2 | 2/2017 | Ostrovsky et al. | |
| 9,621,053 B1 | 4/2017 | Telefus | |
| 2004/0032756 A1 | 2/2004 | Van Den Bossche | |
| 2008/0180866 A1 | 7/2008 | Wong | |
| 2008/0204950 A1 | 8/2008 | Zhou et al. | |
| 2009/0168273 A1 | 7/2009 | Yu et al. | |
| 2009/0213629 A1 | 8/2009 | Liu et al. | |
| 2010/0091418 A1 | 4/2010 | Xu | |
| 2010/0155369 A1 | 6/2010 | Kularatna et al. | |
| 2010/0320840 A1 | 12/2010 | Fridberg | |
| 2011/0156610 A1 | 6/2011 | Ostrovsky et al. | |
| 2011/0292703 A1 | 12/2011 | Cuk | |
| 2011/0301894 A1 | 12/2011 | Sanderford | |
| 2012/0026632 A1 | 2/2012 | Acharya et al. | |
| 2012/0089266 A1 | 4/2012 | Tomimbang et al. | |
| 2013/0051102 A1 | 2/2013 | Huang et al. | |
| 2014/0085940 A1 | 3/2014 | Lee et al. | |
| 2016/0381754 A1 | 12/2016 | Enertron | |
| 2017/0105265 A1 | 4/2017 | sadwick | |
| 2019/0238060 A1 | 8/2019 | Telefus | |
| 2019/0245457 A1* | 8/2019 | Telefus | H02M 7/217 |
| 2019/0280887 A1 | 9/2019 | Telefus et al. | |
| 2020/0007126 A1 | 1/2020 | Telefus et al. | |
| 2020/0044883 A1 | 2/2020 | Telefus et al. | |
| 2020/0052607 A1* | 2/2020 | Telefus | H02M 7/217 |
| 2020/0106260 A1 | 4/2020 | Telefus et al. | |
| 2020/0328694 A1* | 10/2020 | Telefus | H02M 7/217 |
| 2022/0311350 A1* | 9/2022 | Telefus | H02M 1/0006 |

OTHER PUBLICATIONS

Park, Jeong-Eon, et al, Design on Topologies for High Efficiency Two-Stage AC-DC Converter, 2012 IEEE 7th International Power Electronics and Motion Control Conference—ECCE Asia Jun. 2-5, 2012, Harbin, China, p. 257.

Cuk, Slobodan, 98% Efficient Single-Stage AC/DC Converter Topologies, Power Electronics Europe, Issue 4, 2011, www.power-mag.com; p. 16.

* cited by examiner

INTEGRATED ENERGY SUPPLY SYSTEM AND METHODS TO PROVIDE REGULATED AC AND LOW VOLTAGE DC

CROSS-REFERENCE TO RELATED APPLICATIONS

This application is a continuation in part of PCT application PCT/US20/42896 titled AC TO DC CONVERTER filed Jul. 21, 2020 with a common inventor and currently pending, which claims priority to U.S. provisional application 62/987,045 filed Mar. 9, 2020, also with a common inventor, and, this application also claims priority to PCT/US20/44930 TITLED TWO-WIRE ELECTRONIC SWITCH AND DIMMER FILED Aug. 5, 2020 also with a common inventor and currently pending.

STATEMENT REGARDING FEDERALLY SPONSORED RESEARCH OR DEVELOPMENT

Not Applicable.

BACKGROUND OF THE INVENTION

Technical Field

The invention relates to an energy supply system and methods to provide regulated AC and low voltage DC current from AC mains at very high efficiency and integrated on a chip. The invention includes AC to DC converter designs, switching circuitry designs, regulators, in integrated circuit modules that can be assembled to create custom and programmable power supplies for integrated circuit applications.

Related Background Art

DC energy supply units that supply a regulated DC power to an integrated circuit device have typically include a series of separate interconnected units such as a transformer and AC to DC converter that may be included in a unit that includes a wall plug and physically separated from the integrated circuit devices. The term "integrated circuit devices" refers generally to the myriad of devices including lighting and motor controllers and sensors found increasingly throughout homes, factories, automobiles, etc. Any devices requiring a controlled DC source from what might be a variety of AC supplies. The supply voltages for consumer products are typically in the range of 110 to 220 volts at 50 or 60 hz and the required DC voltages typically range from 3 to 70 volts. These devices are becoming smaller. The heretofore available power supplies in many cases were significantly larger than the device itself. In many cases there is also a need for a power supply that is always on to power, for example, sensors and alarms. A high efficiency power supply is required. To cover the gamut of power supply requirements, there is a need for a power supply IC that includes functionality to provide multiple DC outputs both as selectable and as programmable supplies and that may be connected directly to an AC source. There is a need for a power supply that can also provide simply switched AC as well as modulated AC. The latter acting for example as a motor controller or dimmer switch. There is also a need for power supply modules such as comparators, switch controllers, AC to DC converters and voltage regulators to build custom versions of the required power supplies. The modules, and therefore the power supplies that may be stand alone or that may be incorporated into the same integrated circuit as other processors, sensors and controllers. There is a need for a very high efficiency AC to DC converter that may be incorporated into both of a stand alone programmable power supply IC and through design modules that are incorporated directly into the design of IC's including other functionality. Similarly there is a need for a high efficiency bidirectional switch that similarly can be incorporated into both a stand alone programmable power supply IC and provide some of the programmability functions for the power supply IC and through design modules into an IC that incorporates other functionality such as processors and sensors. Background art for the needed AC to DC converter and for the Bidirectional switch are included separately below.

AC to DC Converter Background

The traditional means for providing DC power from a primary AC supply (mains) to an integrated circuit device is through analog circuitry, located separate from the integrated circuit device, that included a step-down transformer, a diode rectifier, and a filter comprising an electrolytic capacitor and resistor. The output voltage depended primarily on the turns ratio of the transformer and the circuit was moderately efficient. However, the size and weight of the magnetic structure required to implement the low frequency transformer obviates the use of this approach in miniature equipment. Additionally turning the power on and off to a targeted integrated circuit device is typically through physically disconnecting the power source to the integrated circuit device.

A later approach that does not use a transformer involves the direct rectification of the AC mains, which rectified waveform is directly applied to a voltage regulation circuit comprising an active solid-state device in either a series or shunt connection. The shunt regulator configuration works by providing a current path across the rectified mains output through a variable resistance device, thereby diverting current away from the load. In the simplest implementation of the shunt regulator, a Zener diode is connected in shunt with the load with a resistor in series with this shunt leg. Any rectifier output voltage in excess of the Zener voltage is dropped across the resistor resulting in the excess power being dissipated as heat. Thus, this regulator configuration is very inefficient. Since the Zener current must be larger than the load current to maintain regulation through the Zener effect, the efficiency of this regulator circuit is much smaller than the ratio of the output voltage to the rms value of the rectified supply voltage.

An improved approach uses a series connected solid-state device, such as a bipolar or field-effect transistor, to buffer the Zener voltage reference. The active device is connected in a source-follower or emitter-follower configuration, with the load connected at the source or emitter and the Zener reference connected at the gate or base. The Zener current can be much smaller than in the shunt configuration, so the total current is largely that supplied to the load. Thus, the efficiency of this circuit is generally no better than the ratio of the input to output voltage.

A further improvement to this circuit function is termed a switch mode power supply. There are numerous such designs known in the art, but the commonality is an input rectifier, a switching element that operates at high speeds to switch a storage element, inductor or capacitor, into and out of the supply. If isolation of the input and output is required a high speed transformer can be introduced, both for isolation and to regulate the output voltage. RC filters are included to reduce ripple in the output. Switch mode power supplies have the advantage of increased efficiency since the power loss mechanisms of the early linear systems are largely eliminated. However, transformer losses can result in reduced efficiency if isolation is required. Also, the high speed switching is a source of considerable RF noise and introduces larger losses in conductors due to skin effects. Theoretically high efficiencies can and have been obtained in specially designed systems. Efficiencies as high as 95% are reported, but actual efficiencies are more typically 60% to 70% in low cost isolated systems.

A disadvantage of all heretofore known systems is that they cannot be easily integrated. Except for restricted special applications, the designs for present power supplies that include AC to DC converters cannot be integrated on a chip with other system functions. The power dissipated in individual circuit elements is too large for system-on-a-chip levels of integration. Components such as the types of transformers required are simply not available for integration on silicon.

Ubiquitous electronics devices and subsystems typically operate at 3.3 or 5 volts. The requirement to convert 120 or 240 volts AC mains to these low operating voltages taxes the efficiency of the heretofore available power converters. For both linear and switched mode power supplies the greater the difference between the input and output voltages the greater the inefficiency. There is a need for a high efficiency and low voltage power supply to supply power to the myriads of low power, low voltage devices. There is a need for a high efficiency, power converter for output voltages between 3.5 and 75 volts DC. There is a need for accompanying switching electronics that can also be fully integrated and operate at high efficiency to connect and disconnect the power supply to the target integrated circuit devices. Electronics proliferate in "smart" cars and "smart" homes. There is a need for small, efficient power supplies that can support always-on sensors and networks and include switching electronics. More and more homes, factories and office buildings, including both new construction and retrofitting, are incorporating electronic sensors to control all uses of power for increased efficiency. There is a need for a low voltage, integrated, high efficiency power supply to support both new construction and retrofitting the power grid existing in homes, factories and office buildings. The power supply must be able to be integrated into the sensor and control electronics to enable such devices to physically fit within the confines of plugs and outlets used to supply local power. There is a need for high efficiency to avoid heat dissipation within the confines of the walls and power grids of homes, offices and factories and accompanying integrated switching devices. There is a need for power converters that have efficiencies in the range of 90 to 100%. Prior US application publication US2019/0280887 teaches an AC to DC converter now U.S. Pat. No. 10,812,282, titled Multifunctional System Integrator, from the same applicant as this application teaches an AC to DC converter integrated into a building power system, but lacks the efficiency of the present invention. There is a need for compact power converters that can fit within a wide range of devices rather than existing as bulky boxes external to the devices. There is a need for power converters and control switches that can be integrated.

Switch Background

Traditional access to alternating current (AC) electrical power in home and business environments is provided by mechanical outlets that are wired into the facility electrical system. These outlets are protected from excessive electrical loads or potentially dangerous ground faults using electromechanical devices such as fuses and circuit breakers. Similarly, the control of conventional electrical room appliances such as lighting and ceiling fans occurs using electromechanical switches. These fundamentally mechanical control devices provide simple on-off control and inevitably wear out and, over time, can cause short circuits or potentially dangerous arcing.

More nuanced control of common electrical appliances is typically provided by electronic devices such as triacs which allow the AC mains waveform to be interrupted on a cycle-by-cycle basis, so-called phase control. Although significantly more efficient than the rheostats or autotransformers that preceded them, triacs are still too inefficient to be used effectively in small enclosures for the control of large electrical loads and can induce electrical noise back into the facility electrical system. Furthermore, they can cause flickering in modern light-emitting diode (LED) lamps that are responsible for adverse health effects.

State-of-the-art AC switches employ high-voltage semiconductor devices such as bipolar transistors or MOSFETs to control the application of AC power to the desired loads. These modern circuits incorporate AC/DC power supplies and transistorized control circuits that require access to all three wires in a typical single-phase circuit: the hot lead from the AC mains, the lead to the switched load, and the common neutral lead. Examples of such state-of-the-art three-wire systems include international application publication WO 2019/133110, Electronic Switch and Dimmer, Telefus et al, filed 7 Nov. 2018.

There is a need for an improved electronic AC control system that provides a wider range of more reliable and highly efficient control. Furthermore, there is a need for such a control system that can be realized using semiconductor devices that can be integrated with other circuitry for advanced power control functions that can be manufactured at low cost, and for a control system that can be simply installed using only two wires: the hot AC mains lead and the load.

SUMMARY OF THE INVENTION

An power supply system that can be integrated on Silicon is described.

In a preferred invention embodiment the power supply system, when combined with low voltage DC devices including semiconductors such as Transistors, MOSFET, OPAM, Digital Gate, Comparator's, Microcontrollers, Microprocessor, Digital system processor (DSP's) transitions them effectively into AC devices.

Fully integrated solutions are in forms of microcontroller units, MCU's or in full monolithic integration.

The list of new AC Devices includes:
1. AC-DC converter that enables an AC connection directly to a traditionally DC device
2. AC Microcontroller
3. AC MOSFET The system and related devices address the need for a compact, integrated, low cost design power supply, that is highly efficient and provides access to the low voltages used to drive typical silicon based electronic devices used in home sensors and networking, smart cars, etc. In some embodiments, the energy supply system further includes an efficient electronic switch.

In another embodiment, to optimize efficiency the voltage across an open switch is minimized as the switch is closed and energy is accumulated and stored in a shunt energy storage element. The electronic switch is opened when the rectified AC mains waveform exceeds a threshold value. While the switch is open, energy is supplied to the load by the energy storage element through the regulator circuit. In this way the benefits of the regulator circuit accrue to the attached load circuitry while the power dissipated within the regulator circuit is greatly reduced compared to the prior art. In another embodiment, the rectifier is eliminated and the switch is synchronized with one half-cycle of the AC mains waveform.

In another embodiment, a comparator is used to control the electronic switch. In one embodiment the comparator is comprised of an operational amplifier and a reference voltage source. In another embodiment the comparator is comprised of a MOS field effect transistor. In one embodiment the MOS field effect transistor is controlled through a voltage divider. In another embodiment the voltage divider is replaced with a reference voltage source. In one embodiment the reference voltage to the comparator includes feedback from the output of the electronic switch, thereby creating functionality a hysteresis comparator as the term is known in the art. In other embodiment the reference voltage is adjustable such that the output of the energy supply system is adjustable form low voltage (~3 V DC) to relative high voltage (~75 V DC) or even higher depending upon the nature of the AC source.

The specific examples are not intended to limit the inventive concept to the example application. Other aspects and advantages of the invention will be apparent from the accompanying drawings and detailed description.

DETAILED DESCRIPTION OF THE INVENTION

Figure 1A:
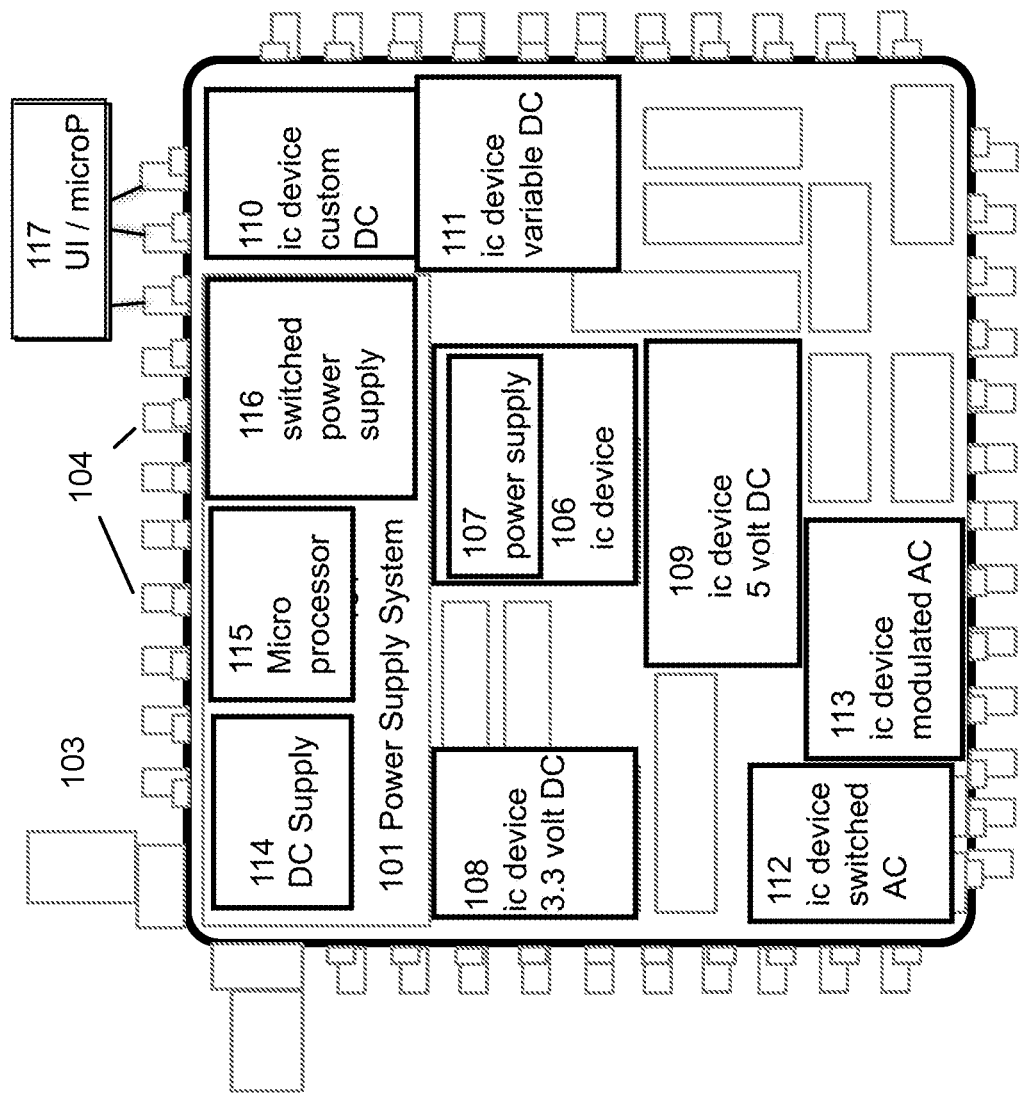
FIG. 1A shows embodiments of the invention as integrated on silicon.

FIG. 1A shows multiple embodiments of the invention. In one embodiment of the invented power supply 101 is a part integrated circuit 100 that includes and supplies power to a plurality of other devices connected directly to AC power supply lines 102, 103 (not to scale). The power supply 101 is integrated into the IC 100. The power supply includes a plurality of output and input or control connectors, not shown, but as are known in the art such to allow connection. The power supply 101 provides AC and DC power to a variety of IC devices 106-113 on the same IC 100 as well as output to other devices through connectors 104 to other devices not located on the IC 100. Non-limiting examples include providing power from the AC mains 102, 103 to:

- devices 106 that further include embodiments of the power supply 107 integrated on the same chip as the device 106;
- devices 108 that require a fixed 3.3 volt DC power supply;
- devices 109 that require a fixed 5 volt DC power supply;
- devices 110 that require a fixed DC power supply at a custom voltage between 3 and 70 DC volts;
- devices 111 that require a variable DC power supply;
- devices 112 that require a switched AC power supply at the mains voltage;
- devices 113 that require a modulated AC power supply, such as through pulse modulation of the AC mains supply; and,
- devices, not shown, that require any of the AC or DC power supplies that are located off of the module 100 and connected through the connectors 104.

In one embodiment, all such power supplies are switched on and off in the connection to the AC mains 102, 103 using the bidirectional switch as described below. In another embodiment the power supply is controlled through a microprocessor 114 that is incorporated into the power supply IC 101. In another embodiment the power supply is controlled through a microprocessor 117 that is located remote from the multichip package 100. In another embodiment the external microprocessor 117 includes a user interface to allow human interaction and control of the power supply 101 including selecting on and off, variable voltages such as for dimming and motor control of lights and devices located either on the same module 100 or remotely. Connections to user interfaces and microcontrollers 117 are made through both wire and wireless, as known in the art, means. In another embodiment the power supply 101 is a fully functional microcontroller with a power DC power supply 114 and a processor 115 that further incudes memory, I/O and multiple switched and programmable power sources 116.

Figure 1B:
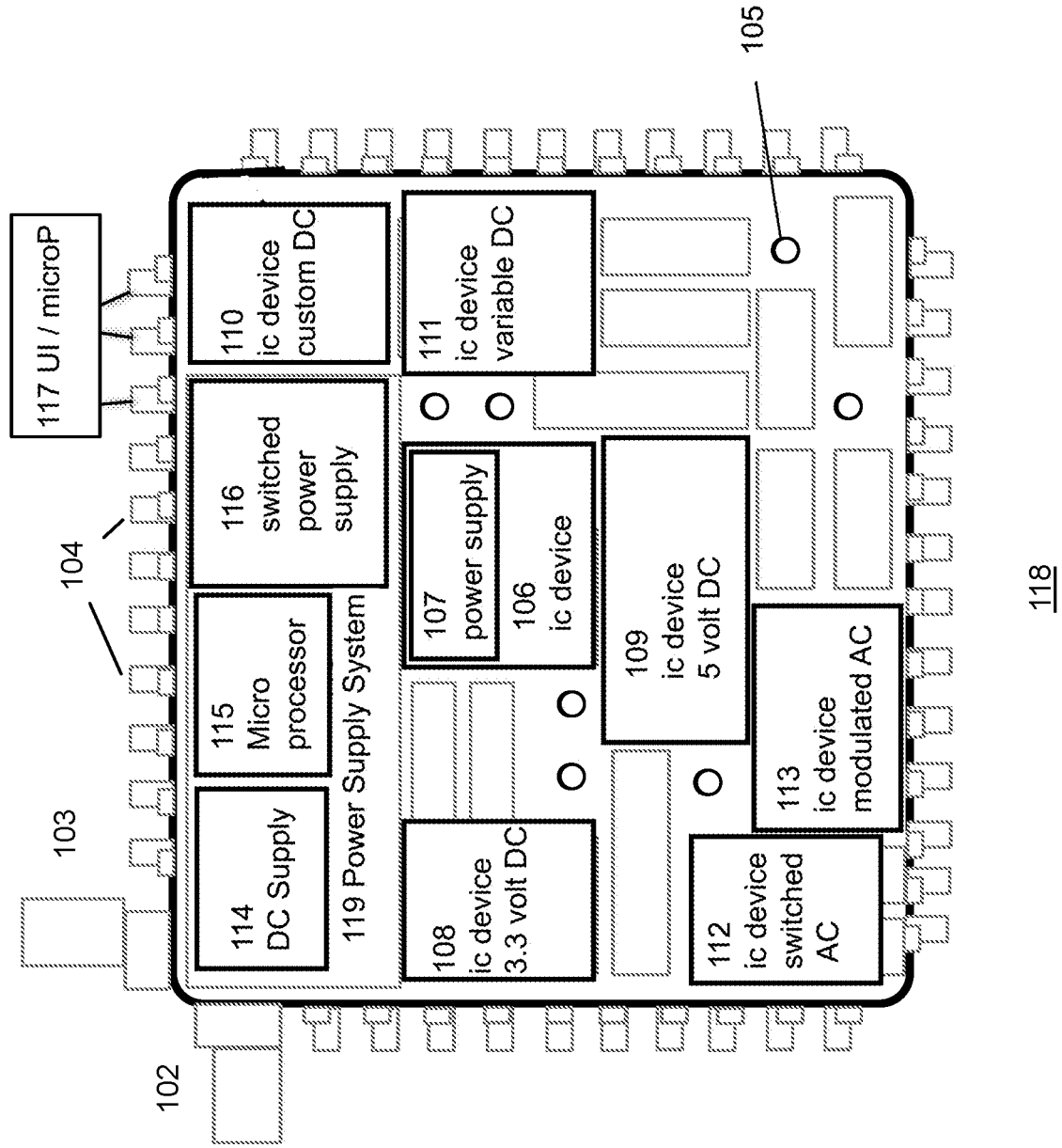
FIG. 1B shows embodiments of the invention as part of a multichip package.

FIG. 1B shows a second embodiment where the power supply 119 is part of a multichip package 118 where a plurality of devices 106-113 as already described are connected through the multilayer circuitry of the multichip package 118 including through holes 105 and other connection means as are known in the art.

Figure 2:
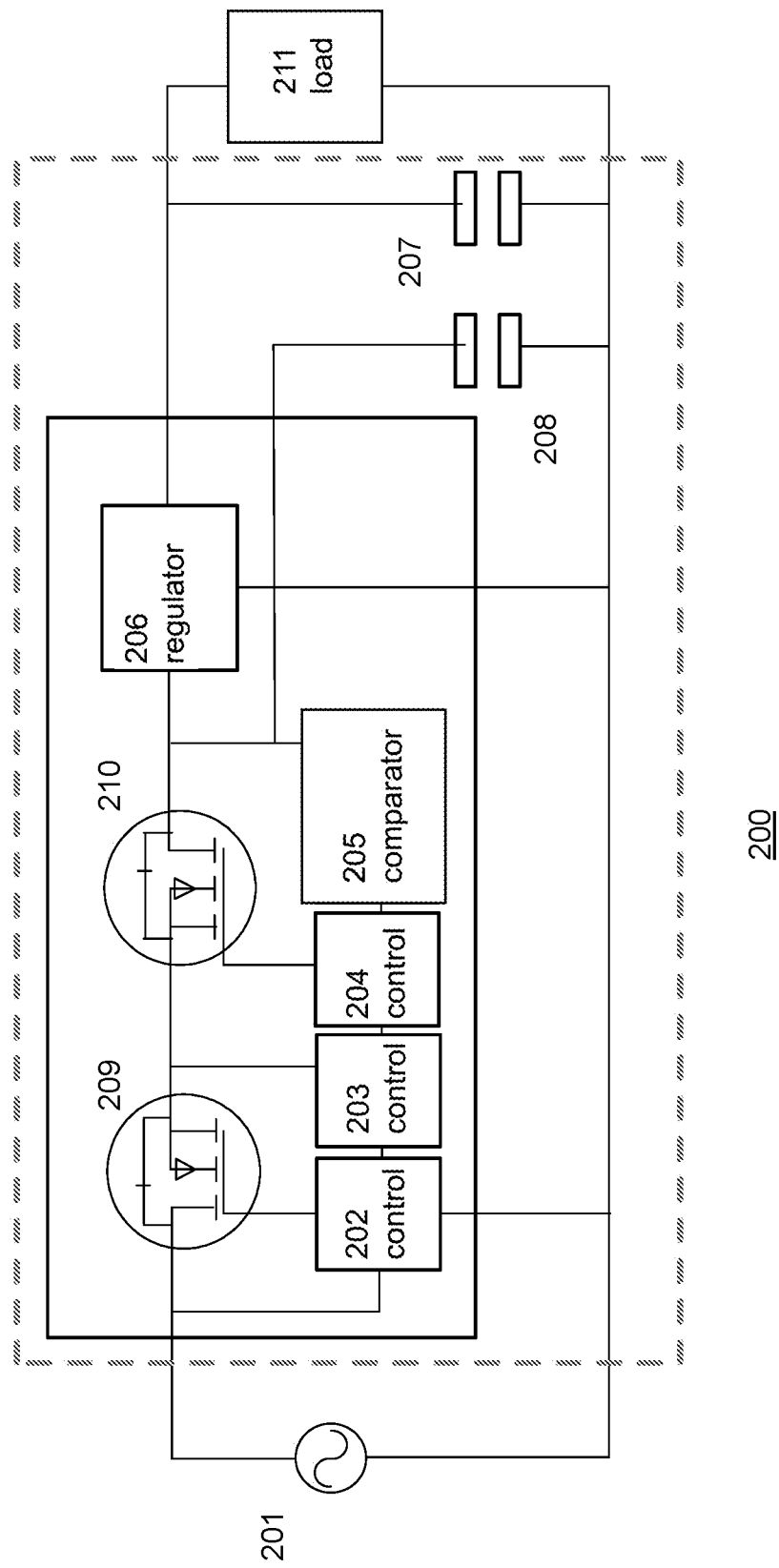
FIG. 2 shows a first embodiment of the invented system.

FIG. 2 shows the invented design for integrating with a variety of microprocessors and microcontrollers and further including a high power switching device 209, 210, and control system blocks 202, 204 for the switching device. The power source provides a switched, pre-selected, and programmable DC voltage to a load 211 from an AC source 201. The power source includes MOSFET driver 202, 204 that drive the bidirectional switch comprising MOSFETS 209, 210 operating to turn power on and off to an AC to DC converter comprising a hysteretic comparator 205 that in conjunction with current limit and zero voltage control circuitry 203 stores DC power on a capacitor 207 that in turn supplies a regulated 206 DC power to the load 211. The current limit and zero voltage circuitry in this embodiment further includes capacitor 208. All components except perhaps the storage units, here capacitors 207, 208, can be integrated on silicon. The details of all components are as discussed below.

Figure 3:
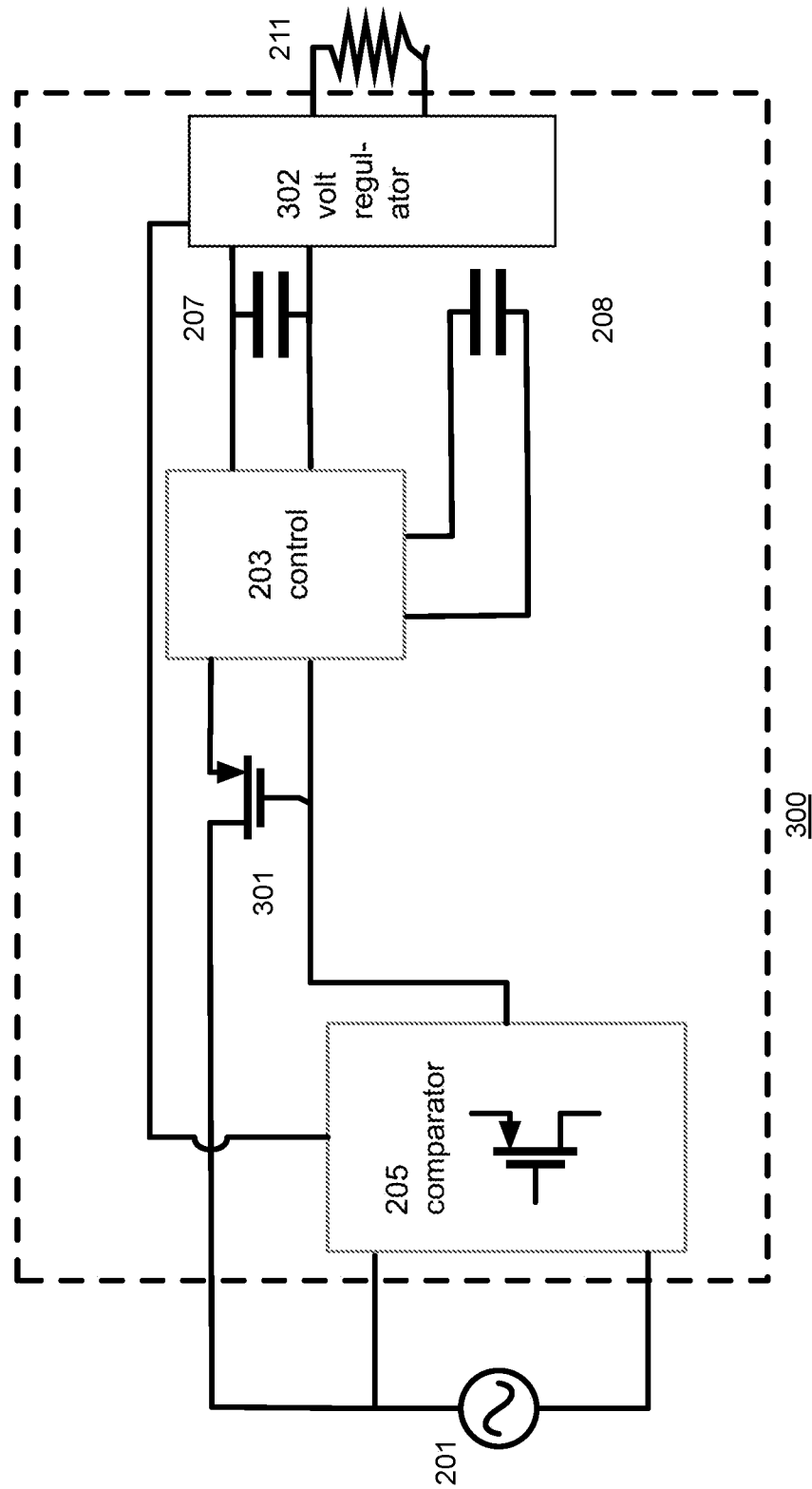
FIG. 3 shows a block diagram of an embodiment for a DC power supply.

FIG. 3 shows a block diagram of a DC power source 300 embodiment the invention. The power source supplies a regulated DC power to a load 211 from an AC source 201. The DC power source 300 includes a hysteretic comparator 204 that, in conjunction with a current limit and zero voltage sensing circuitry 203, controls a MOSFET switch 301 to close over a portion of the AC power cycle at the zero point crossing and charge storage unit 207 here a capacitor to a pre-selected voltage. The capacitor 207 is connected through a voltage regulator 302 to the load. The current limit and zero sensing circuitry also includes a storage means, here a capacitor 208 to ensure efficient switching of MOSFET 301 and therefore the efficiency of the AC/DC converter 300. Details of the individual components are discussed below in conjunction with embodiments of the AC to DC converter. The load 211 may be an external device or a device integrated on the same silicon as the DC Power source 200. In one embodiment the power source 200 is part of an AC power supply, supplying a DC power to a switch control circuit 202 included in the AC power supply. The AC source 201 in one embodiment is the AC mains of a building power supply. In another embodiment the AC source 201 is the output of an AC power supply as shown in FIG. 2B. The embodiment shown includes two connections, typically hot and neutral, to the AC source. In other embodiments discussed below the AC/DC converter is connected to only a single phase between the AC source and the load. The DC-DC Regulator 302 includes the capabilities of an input voltage between 3 and 75 DC volts.

Figure 4:
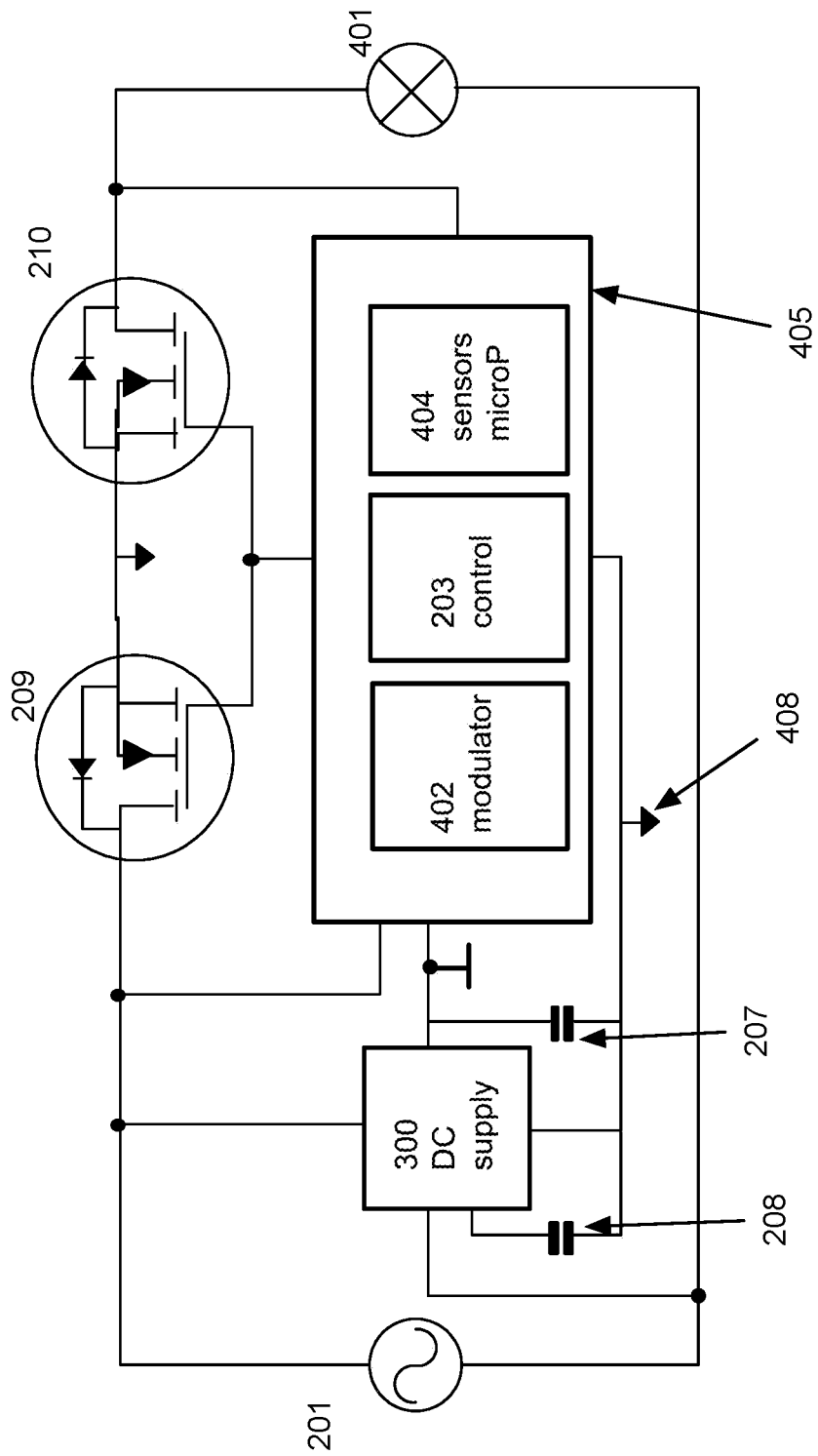
FIG. 4 shows a block diagram of an embodiment for a bidirectional switch device.

FIG. 4 shows a block diagram of a bidirectional switch as included in embodiments of the power supplies. The switch controls power from the AC mains supply 201 to an AC load 401. The back to back MOSFETS 209, 210 form a high speed bidirectional switching device controlled by modulator 402 and switch control device 203. The power supply further includes current and voltage sensors, and, a microprocessor 404 linked to the switch control device 203 to provide over current and over voltage protection for both the bidirectional switch and the load 401. Power to the modulator 402, switch control 203 and sensors 404 is provided by the AC/DC converter 300.

AC to DC

Figure 5:
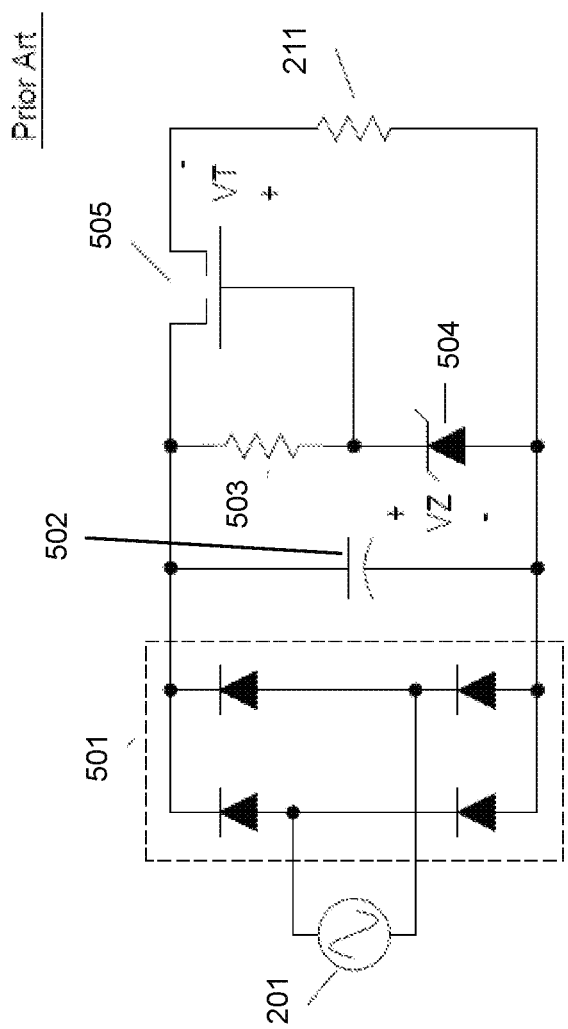
FIG. 5 is a schematic diagram of a prior art AC-DC converter.

The AC to DC converter enables much of the functionality of the power supply system. It provides a DC power source to the internal functionality of the power supply itself as well as DC power to both integrated and external devices. FIG. 5 shows a schematic diagram of a prior art AC-DC converter circuit. The single-phase AC mains 201 waveform is sinusoidal and is full-wave rectified by diode bridge 501 and the resulting time-varying DC voltage waveform is smoothed by capacitor 502, typically an electrolytic capacitor. Note that there is no control for the charging of this capacitor 502. The rectified line voltage is applied to this capacitor, therefore a capacitor having a large capacitance value and a voltage rating greater than the peak value of the rectified AC mains waveform is required. The smoothed voltage waveform is applied to the input of a series regulator circuit including bias resistor 503, Zener diode 504 having a characteristic Zener voltage VZ, and pass transistor 505, here represented as an enhancement mode MOS field-effect transistor (MOSFET) having a characteristic threshold voltage, VT. The regulator output is applied to the load 211.

In operation, the pass transistor 505 dynamically adjusts its drain-source voltage to keep the load voltage at VZ-VT. In other words, pass transistor 505 forms a source-follower circuit that buffers the Zener voltage, VZ. Since the full load current passes through pass transistor 505 and assuming that the Zener bias current is negligible, the efficiency of this regulator circuit is simply the ratio of the load voltage to the rms value of the supply voltage. Thus, if the desired load voltage is nominally 3.3V and the supply voltage is 120V rms, then the efficiency is less than 3%. Furthermore, if the load requires only a few tens of milliamperes of current, then pass transistor 505 must continuously dissipate several watts of power as heat. This amount of dissipation typically leads to an unacceptable temperature rise in miniature, enclosed equipment.

Figure 6:
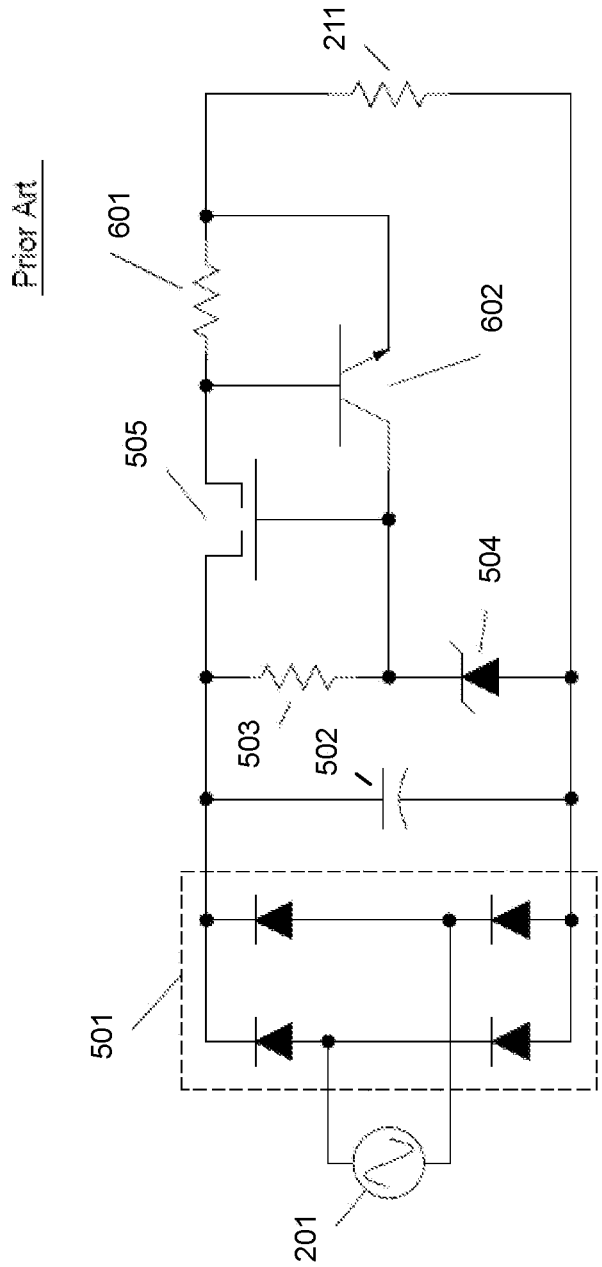
FIG. 6 is a schematic diagram of a prior art AC-DC converter with current limiting.

A further limitation of the circuit of FIG. 5 is that it provides no protection against output current transients that could damage pass transistor 505. Such transients could occur as a result of accidental shorting of the output terminals during operation or testing, or as a result of capacitive load impedance components. FIG. 6 shows a schematic diagram of a prior art AC-DC converter that includes additional components to limit the output current, thereby protecting the pass transistor 505. In FIG. 6 a current sensing resistor 601 having a small resistance value is placed in series with the load, and current limiting bipolar transistor 602 is connected between the gate of the pass transistor 505 and the load 211 forming a protective current limiter circuit. Now if the voltage drop across resistor 601 exceeds approximately 0.7V (for silicon bipolar transistors) then transistor 602 begins to conduct which reduces the gate-source bias on pass transistor 505, thereby reducing the output current. However, the efficiency of this improved circuit is essentially unchanged compared to that of the circuit shown in FIG. 5.

In order to improve the efficiency of these prior art series regulator circuits, the power dissipated in the pass transistor must be significantly reduced. In one embodiment of the present invention, the pass transistor is disconnected from the rectified supply voltage when it is not needed.

Figure 7A:
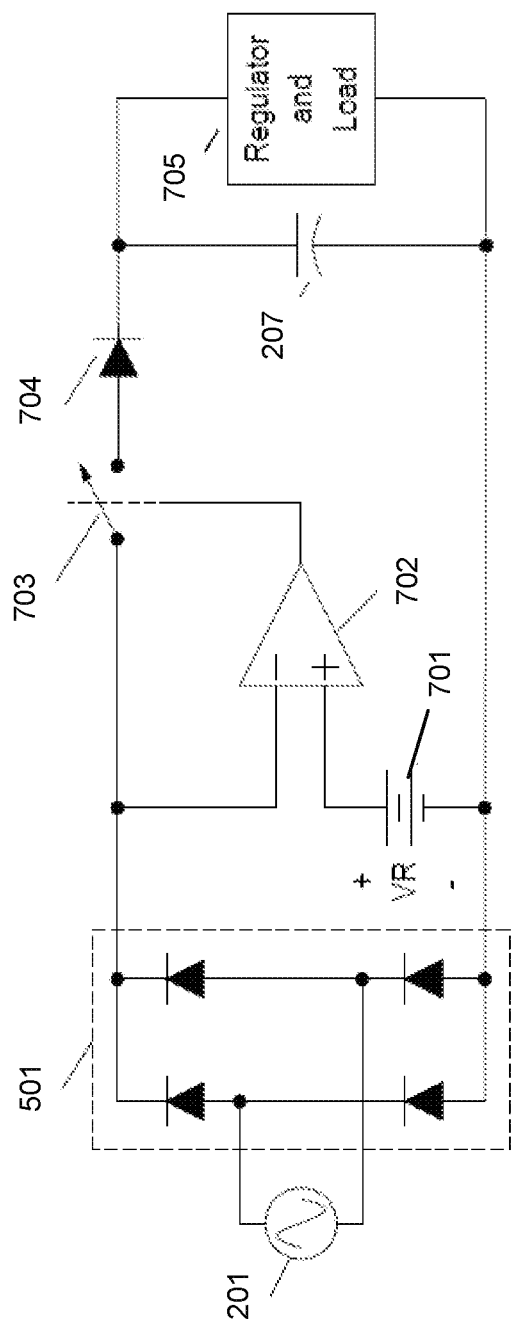
FIG. 7A is a schematic diagram showing the functions in an improved circuit.

FIG. 7A shows a schematic diagram of an improved rectifier circuit that includes the AC mains 201, the diode bridge 501 and capacitor 207, but having additional circuitry 701-704 inserted between the diode bridge 501 output and the capacitor 207. The waveform at the diode bridge 501 output is simply a full-wave rectified sinusoidal waveform that conventionally varies from 0V to approximately 170V peak for a conventional AC mains having an rms value of 120V. Note, however, that the method described below applies to any periodic power waveform assuming that the numeric specifications of the affected components are suitably adjusted. Additionally, the power waveform can include a DC offset if it is smaller than the reference voltage described below.

The additional circuitry includes a comparator circuit 702 having its inverting input connected to the diode bridge 501 output and a voltage reference 701 connected to its non-inverting input, wherein the comparator 702 controls a series switch 703 that disconnects the diode bridge output from succeeding circuitry (opens switch 703) if the diode bridge output voltage exceeds the reference voltage VR. On the other hand, when the reference voltage VR exceeds the diode bridge output voltage then switch 703 is closed and capacitor 207 (note labeled for consistency as in block diagrams of FIGS. 1-3) is charged through series diode 704. Diode 704 keeps capacitor 207 from discharging back through switch 703 when the diode bridge output voltage decreases. The combination of diode 704 and capacitor 207 form a "peak detector" circuit that stores energy in each one-half of an AC mains cycle to supply to subsequent regulator circuitry and the load 705. Unlike the other prior art examples, the voltage across capacitor 207 need only be large enough to satisfy the energy requirement of the subsequent regulator circuitry and load 705. The input voltage to the series regulator is significantly reduced compared to the rms value of the AC mains. The operation of the "peak detector" circuit ensures the peak voltage stored on capacitor 207 is always VR, regardless of fluctuations in the peak voltage of the AC mains, as long as the voltage of the AC mains remains larger than VR. This embodiment of a switching circuit operates as a voltage regulator circuit itself. Since the operation of switch 703 uses negligible energy, the efficiency of the overall improved AC-DC converter circuit shown in FIG. 7A is much larger than seen for the prior art circuits of FIGS. 5 and 6. An additional benefit is a significant reduction in operating temperature rise. Although the comparator 702 is a well-known analog circuit element other analog or digital circuits could be employed to accomplish the desired thresholding function needed to operate switch 703.

In one embodiment the reference voltage VR is fixed. In another embodiment, the reference voltage can be varied. In another embodiment the reference voltage is selectable. In one embodiment the circuit of FIG. 7A is connected to the load and the regulator aspect of the circuit is used to control voltage supplied to the load. In another embodiment an additional regulator 705 is used in series with the circuit of FIG. 7A and the load.

Figure 7B:
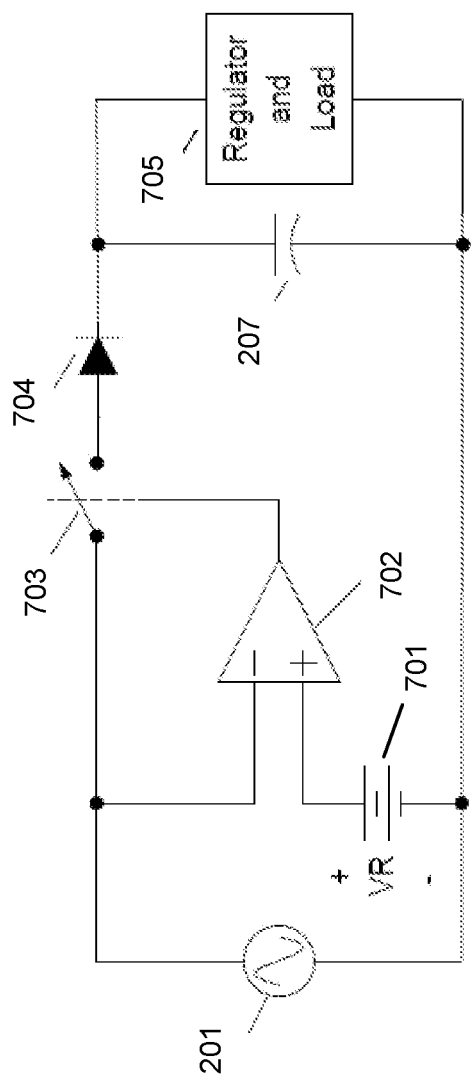
FIG. 7B is a schematic diagram showing the circuit of FIG. 7A without a full-wave rectifier

As noted above, the operation of this circuit does not depend on the availability of a full-wave rectified AC mains waveform. In fact, assuming that the specifications of elements 701-705 are adequate to handle the negative excursion of the AC mains waveform, the diode bridge 501 can be eliminated and the switching and regulation components can be connected directly to the AC mains resulting in the embodiment shown in FIG. 7B. Note that peak detector diode 704 also blocks reverse current through the load during the negative half cycle of the AC mains when switch 703 will be closed. The only disadvantage of this embodiment relative to that illustrated in FIG. 7A is that the total maximum power available to the load is halved.

Figure 8:
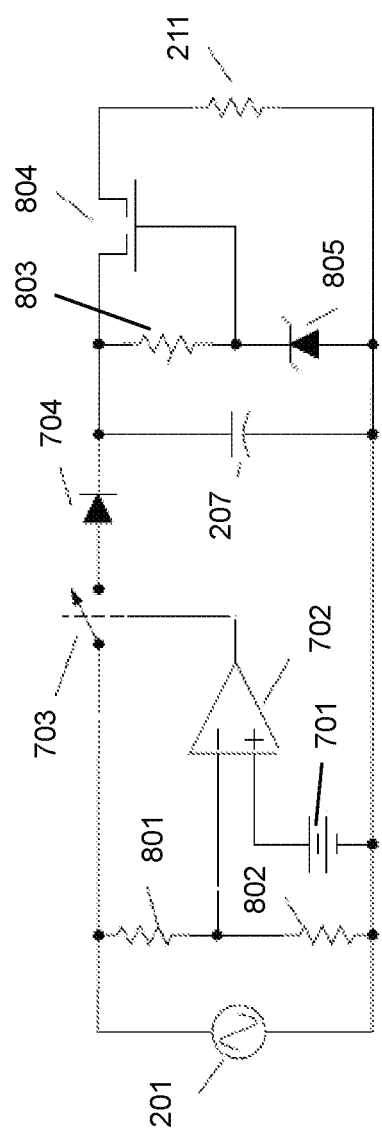
FIG. 8 is a schematic diagram showing an improved AC-DC converter.

FIG. 8 shows a schematic diagram of an improved rectifier circuit interconnected to a series regulator 803-805 and load 211 and provides a convenient basis for establishing the relationships among design variables in the new rectifier circuits to be described below. Voltage to the comparator 702 is through divider network of resistors 801, 802. The comparator 701-704 is as already described. To maintain regulation of the output voltage, the voltage across capacitor 207 must exceed the Zener 805 voltage, VZ. However, capacitor 207 will discharge linearly in time over a half period of the AC mains due to the nominally constant current provided to the load 211. Thus, capacitor 207 must initially be charged to a peak voltage Vpeak=VZ+Iload*tMAINS/(2*C103), where tMAINS is the period of the AC mains waveform. This gives the value of capacitor 207 as a function of the difference between Vpeak and VZ. Higher values of Vpeak also result in higher power dissipation in pass transistor 804, and this can be traded against the maximum practical value of capacitor 207. The efficiency of the regulator is the ratio of the power delivered to the load divided by the total power dissipated in the circuit and is given by 2*(VZ−VT)/(VZ+Vpeak). Since the minimum value of Vpeak is VZ, the best case efficiency is simply 1−VT/VZ.

Figure 9:
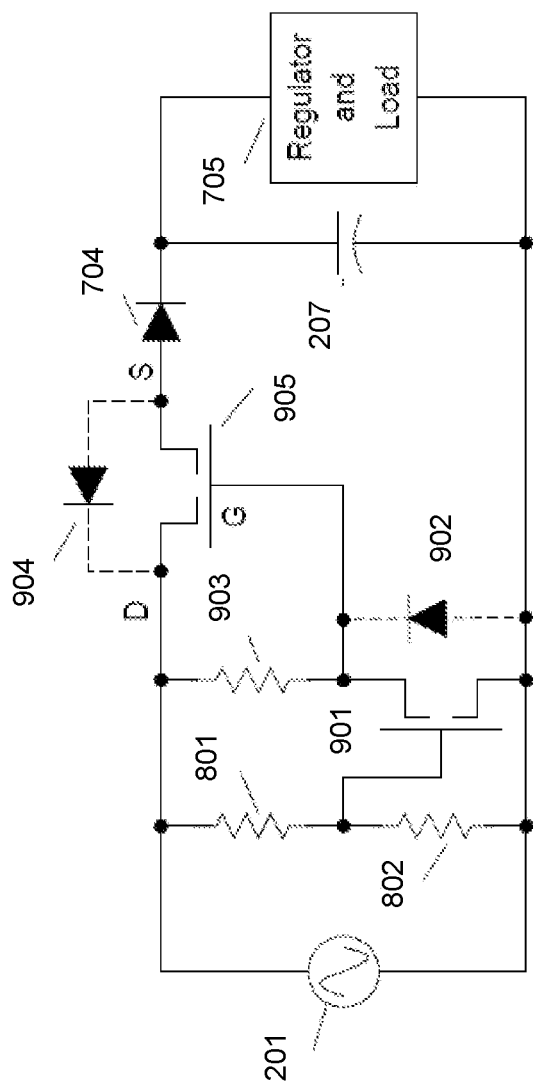
FIG. 9 is a schematic diagram of an embodiment of the improved circuit in FIG. 8 using MOS field-effect transistors.

FIG. 9 shows a schematic diagram of an improved rectifier circuit wherein the switch 703 is implemented using an enhancement mode MOSFET 905 and the comparator circuit is realized as a single common-source amplifier stage also using an enhancement mode MOSFET 901 characterized by a threshold voltage, VT1, and a load resistor 903. Thus, when the output of the voltage divider network comprising resistors 801 and 802 exceeds the threshold voltage of MOSFET 901, VT1, the gate of MOSFET switch 905 is pulled to ground thereby opening switch 905. When the output of the voltage divider network 801, 802 is smaller than VT1 the gate of MOSFET 905 is connected to its drain, thereby closing the switch. However, MOSFET 905 is not an ideal switch, and significant power dissipation may be experienced while it is in its conducting state, so that the efficiency of the circuit realized using MOSFETs will not be as great as that obtained in the ideal case shown in FIG. 8. The efficiency issue derives from the fact that as the drain and gate voltages of MOSFET 905 increase on the positive half cycle of source 201, drain current Id(t) flows from drain to source when the gate voltage exceeds the source voltage by MOSFET's 905 threshold voltage, VT2, and the source voltage of MOSFET 905 rises to within its threshold voltage, VT2, of the gate voltage. The drain current ceases when MOSFET 905 is turned off by MOSFET 901. Thus, the drain-source voltage of MOSFET 905 during the charging current transient is also approximately its threshold voltage, VT2, which is normally around 4-6 volts for power FETs. Consequently, the instantaneous power dissipated in the MOSFET 905 during the charging current transient is simply Id(t)*VT2, which can be appreciable compared to the power delivered to the load by the same current transient.

Additionally, as a result of their fabrication process, power MOSFETs typically include a parasitic source-to-drain diode 904 associated with MOSFET 905, and, parasitic source-to-drain diode 902 associated with MOSFET 901. Note that diode 904 could allow capacitor 207 to discharge when MOSFET 905 is "off", but series track and hold diode 704 blocks this spurious discharge path. The existence of the parasitic diodes 904 and 902 is assumed in subsequent diagrams. In one embodiment, all of the components of FIG. 9 are fabricated on a single semiconductor chip. In another embodiment all of the components of FIG. 9, except for capacitor 207 are fabricated on a single semiconductor chip.

Improvements in Efficiency: Hysteretic Comparator

Figure 10:
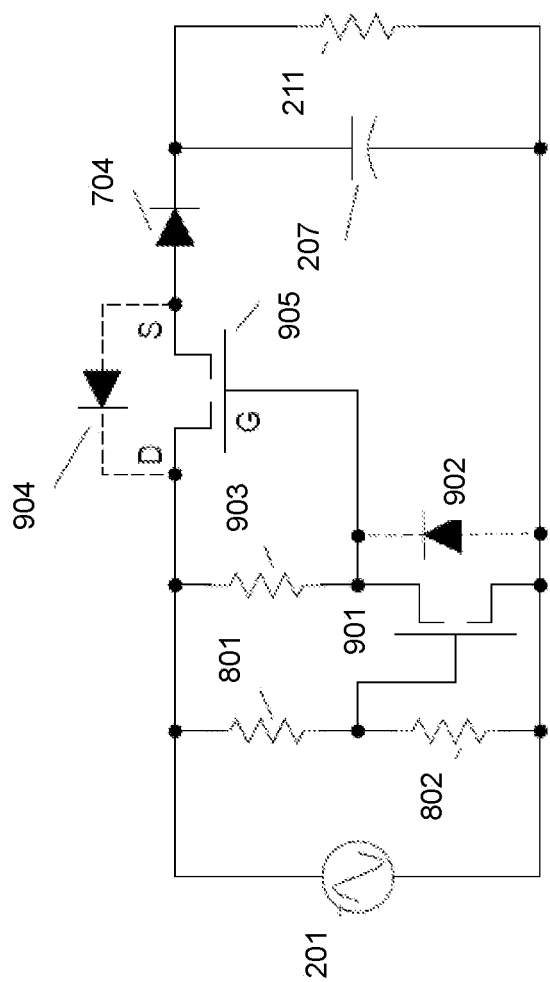
FIG. 10 is a schematic diagram of a simplified version of FIG. 9.
Figure 11:
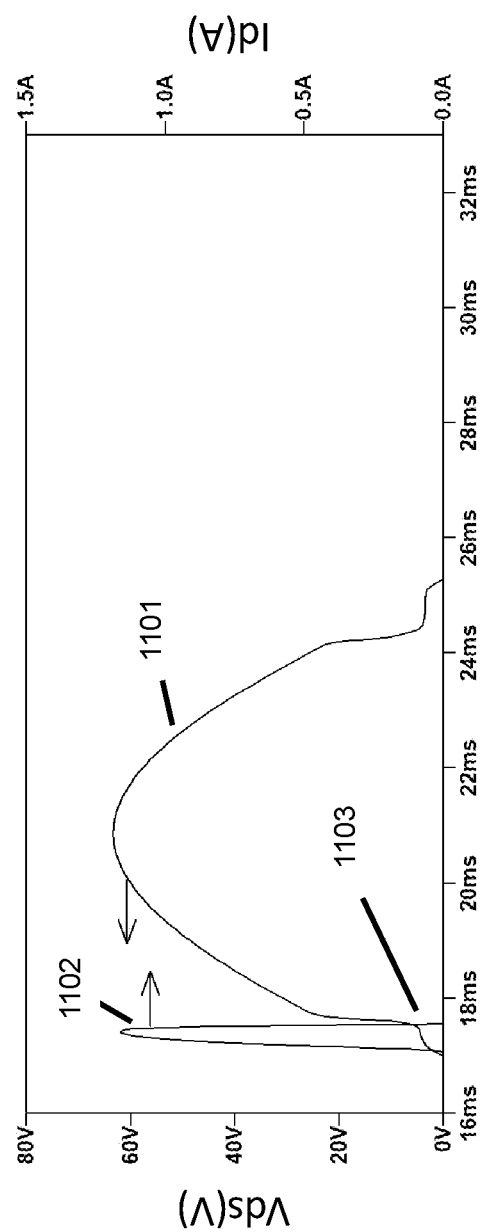
FIG. 11 shows drain-to-source voltage and drain current waveforms for the MOSFET switch in FIG. 10 produced by a circuit simulation program.

FIG. 10 is the schematic diagram of a simplified version of the rectifier circuit of FIG. 9 for circuit simulation to provide a basis for comparison of efficiencies of the preferred embodiment higher efficiency circuits to be described below. For simplicity the voltage regulation circuitry is omitted and the load is represented by a resistor 211. The results of SPICE simulation of the circuit of FIG. 10 assuming a 60 Hz AC mains frequency appear in FIG. 11 which shows the waveforms of the drain-source voltage 1101, Vds, and drain current 1102, Id, of switch MOSFET 905 over one cycle of the AC mains 201. Note the pedestal 1103 having an amplitude of approximately VT2, the threshold voltage of MOSFET 905, on the Vds waveform 1101 coincident with the drain current transient. Efficiency is the ratio of the average power delivered to load 211: (Id*Vload) divided by the average power delivered to the switching circuit by the AC mains (Id*VAC) and is 68%. Fully 30% of the power supplied by the AC mains is dissipated in switch MOSFET 905.

Figure 12:
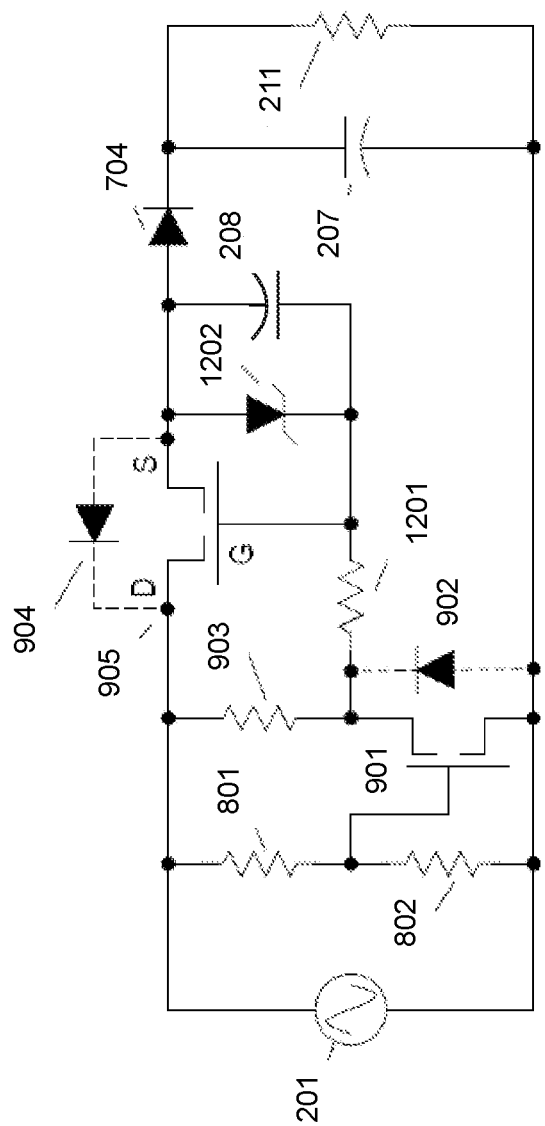
FIG. 12 is a schematic diagram of an embodiment of the zero voltage switching circuit using MOS field-effect transistors.
Figure 13:
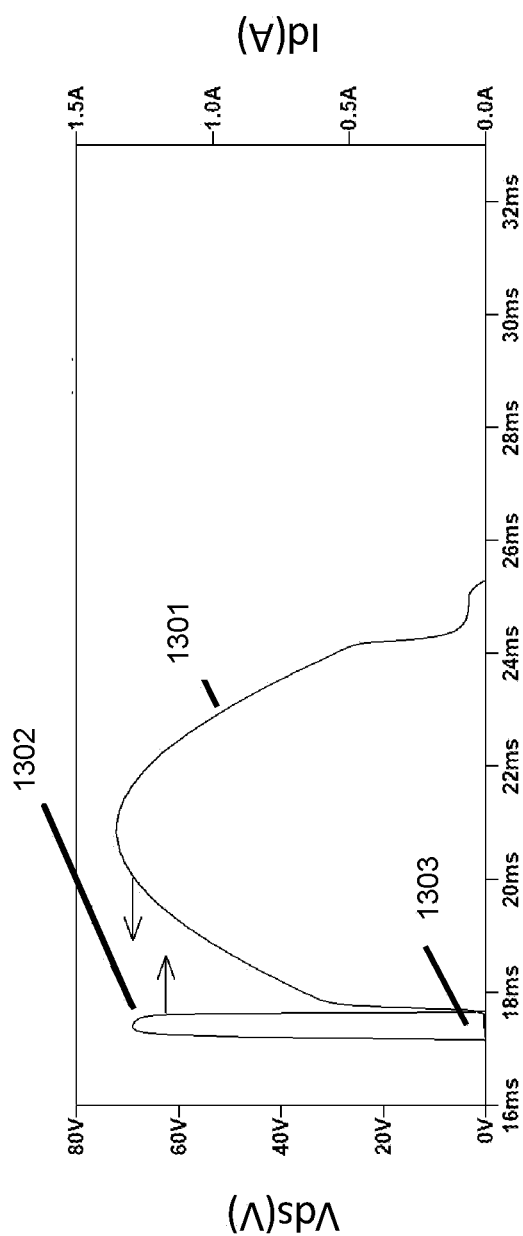
FIG. 13 shows drain-to-source voltage and drain current waveforms for the MOSFET switch in FIG. 12 produced by a circuit simulation program.

To overcome this VT2 "overhead", the higher efficiency circuit of FIG. 12 includes current limiting resistor 1201 and Zener diode 1202 shunted by capacitor 208 connected between the gate and source of MOSFET 905. During the negative half cycle of source 201 current flows from ground, through the body diode 902 of MOSFET 901, through the added components 1201, 1202 and capacitor 208 and back to 201 through the body diode 904 of MOSFET 905, resulting in the Zener voltage Vz of diode 1202 being stored on capacitor 208. Note that this stored voltage applies a positive bias on the gate of 905 relative to its source equal to Vz, which can be greater than VT2. Thus, when MOSFET 905 comes back on at the start of the positive half cycle of 201, its drain-source voltage can be much smaller than VT2, limited only by the intrinsic channel resistance, rds, of MOSFET 905, which is typically much less than one ohm. The results of SPICE simulation of this "zero voltage" switching circuit appear in FIG. 13, again showing the waveforms of the drain-source voltage 1301, Vds, and drain current 1302, Id, of MOSFET 905 over one cycle of the AC mains. Note that the Vds waveform is nearly zero during the drain current transient 1303. The efficiency of this circuit is 89% and less than 2% of the power supplied by the AC mains is dissipated in MOSFET 905.

Since the precharging of capacitor 208 to the Zener voltage of diode 1202 on the negative half-cycle of the AC mains provides gate bias for MOSFET 905, resistor 903 is no longer needed to provide it.

Figure 14:
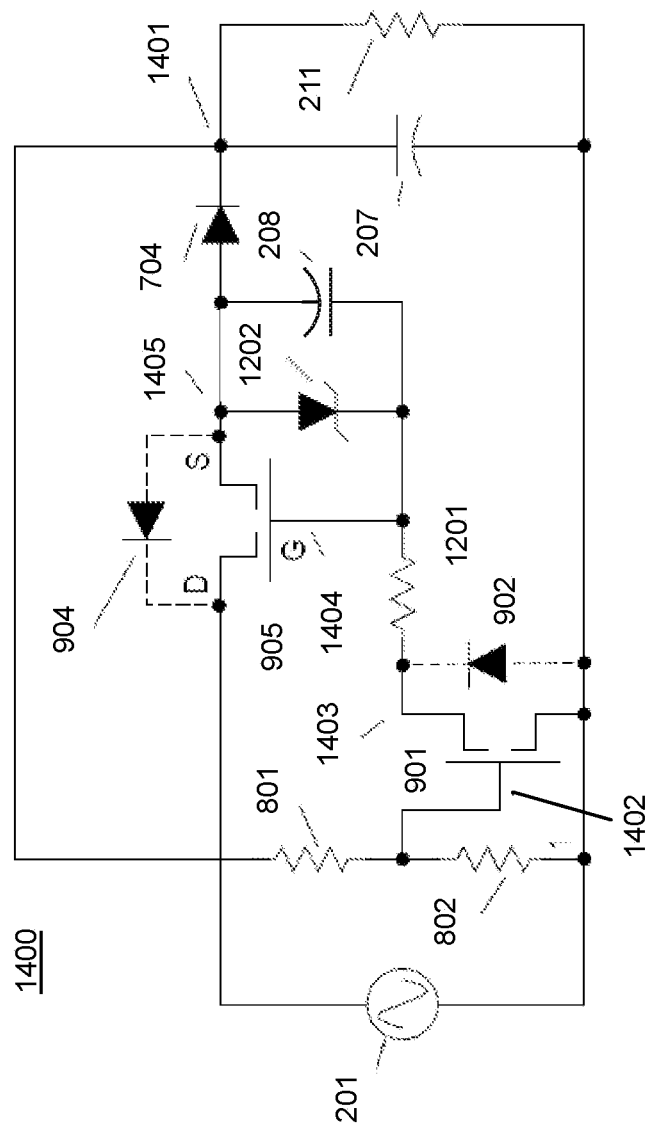
FIG. 14 is a schematic diagram of an alternative embodiment of the zero voltage switching circuit using MOS field-effect transistors.
Figure 15A:
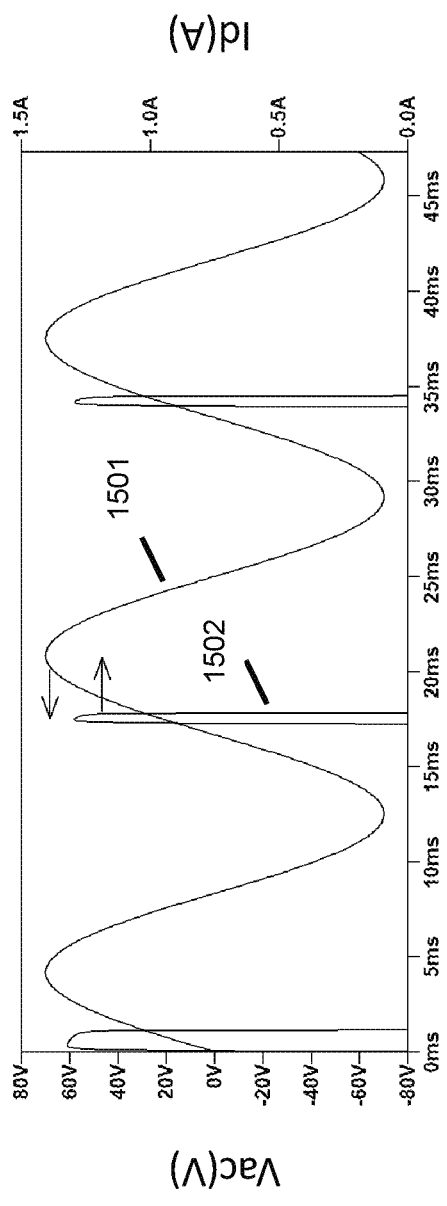
FIG. 15A shows the AC mains voltage waveform and the drain current waveform for the MOSFET switch in FIG. 14 during circuit start-up produced by a circuit simulation program.
Figure 15B:
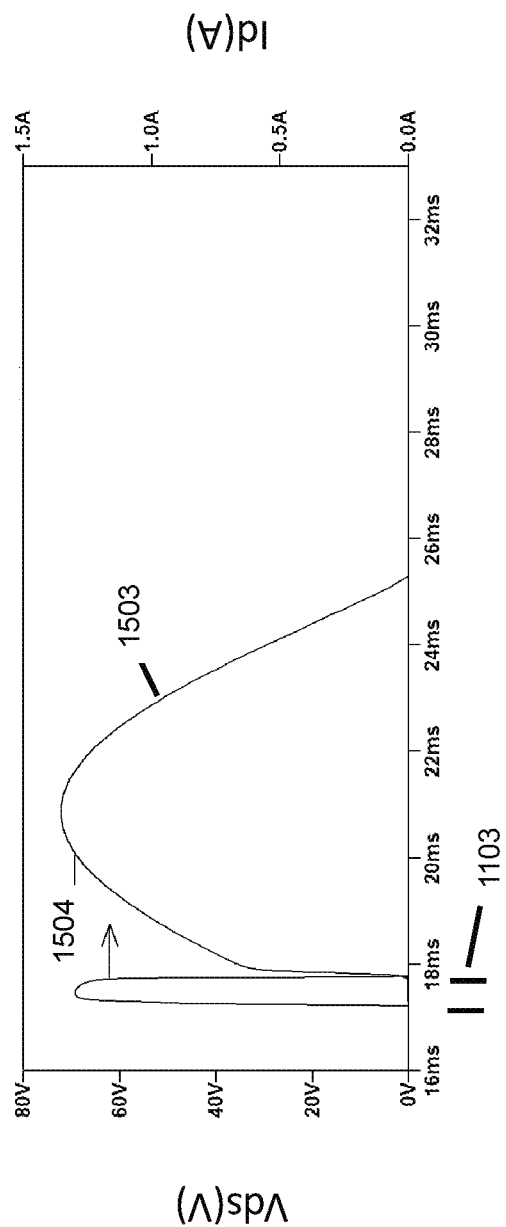
FIG. 15B shows drain-to-source voltage and drain current waveforms for the MOSFET switch in FIG. 14 in the steady state produced by a circuit simulation program.

Another embodiment of the zero voltage switching circuit, shown in FIG. 14, eliminates the load resistor (item 903 of FIG. 12) in the drain circuit of MOSFET 901 which also provides a parasitic discharge path for capacitor 208 through MOSFET 905 that limits the duration of the drain current transient in the circuit of FIG. 12. Additionally, bias resistor 801 is disconnected from AC mains 201 and is connected directly to the DC output node at the junction 1401 of diode 704, load resistor 211 and capacitor 207. Thus, MOSFET 901 conducts, turning switch MOSFET 905 off when the DC output node voltage reaches a threshold value established by resistors 801 and 802 and the threshold voltage of MOSFET 901. FIG. 14 shows an embodiment 1400 of the zero voltage switching circuit of FIG. 12 now including bias resistor 801 connected between the DC output node 1401 and the gate of MOSFET 901. Thereby providing positive feedback from the output through resistor 801 to the hysteresis comparator formed using MOSFET 901, resistors 801, 802, with feedback from the output through resistor 801. The results of SPICE simulation of this circuit appear in in FIG. 15A and FIG. 15B. FIG. 15A shows the three initial cycles 1501 of the AC mains 201, Vac, at circuit startup and the drain current 1502, Id, of MOSFET 905 and shows that the drain current transient 1503 reaches steady state after the first negative half cycle of the AC mains 1501. FIG. 15B again shows the waveforms of the drain-source voltage 1503, Vds, and drain current 1504, Id, of MOSFET 905 over one cycle of the AC mains in the steady state. Because of the larger drain current transient duration 1505, the total power delivered to the load increases by 25%. The efficiency of this zero voltage switching circuit increases to 90% and less than 1% of the power supplied by the AC mains is dissipated in MOSFET 905.

The preferred embodiment includes: An AC to DC conversion system (1400) for providing energy from an alternating current (AC) power source (201) in a direct current (DC) to an electronic load (211) at an output node (1401) comprising:
- a. a voltage divider (801, 802) connected across the load (211), and,
- b. a first switch (901), having an input (1402) and an output (1403), connected through its input (1402) to the voltage divider, and,
- c. a second switch (905), having an input (1404) and an output (1405), whose input (1404) is connected to the output (1403) of the first switch (901), and,
- d. a storage capacitor (207) connected through a diode (704) to the output (1405) of the second switch (905), and,
- e. a Zener diode (1202), having a Zener voltage, connected between the input (1404) and output (1405) of the second switch (905), thereby clamping a voltage between the input (1404) and the output (1405) of the second switch (905) to the Zener voltage of the Zener diode (1202), and,
- f. the electronic load (211) connected to the storage capacitor (207).

In a first embodiment, as shown in FIG. 114, the switches 901, 905, are N-MOSFET transistors. In another embodiment, functionally equivalent to FIG. 10, but not shown, the switches 901, 905 are bipolar transistors.

Figure 16:
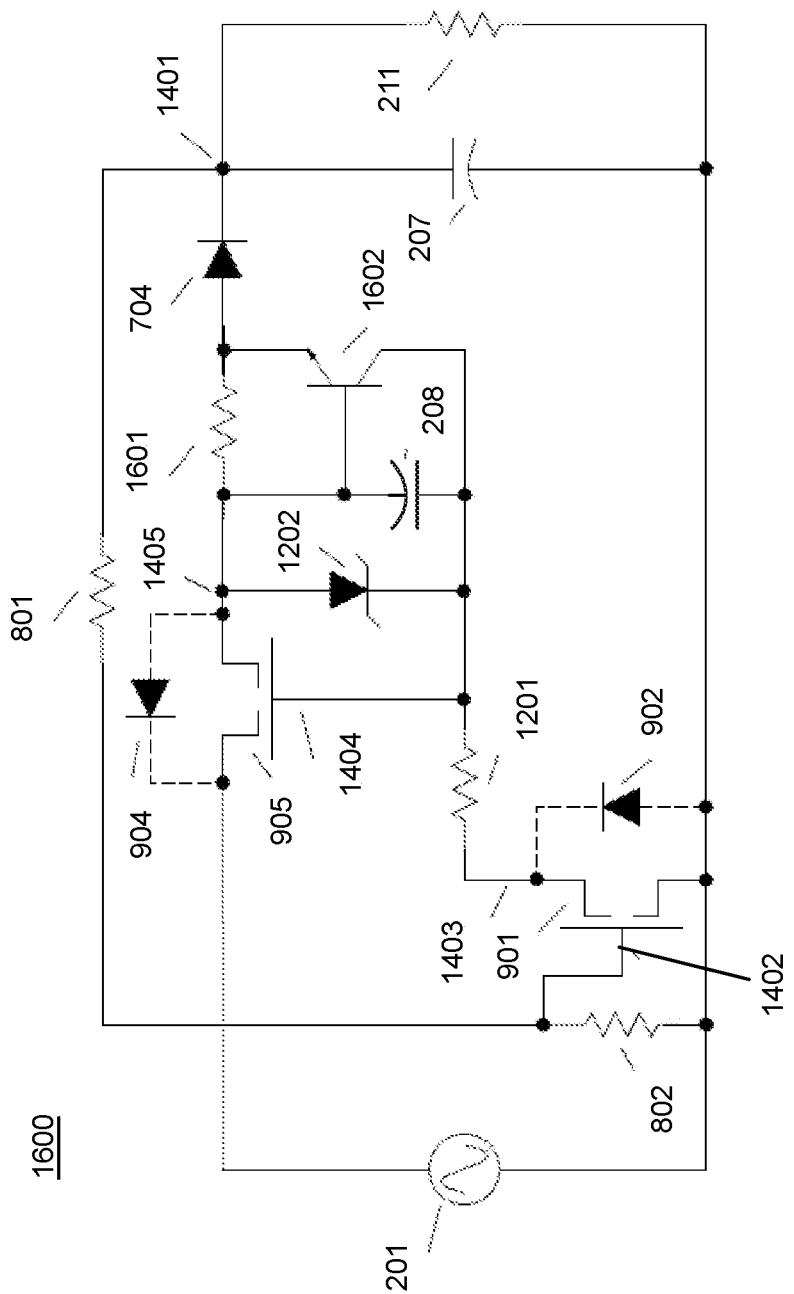
FIG. 16 is a schematic diagram of a preferred embodiment of the zero voltage switching circuit of FIG. 12 including output current limiting and negative feedback stabilization of the output voltage.

In another embodiment shown in FIG. 16, the AC to DC converter 1600 includes an overcurrent protection circuit interposed between the output 1401 of MOSFET switch 905 and the input of diode 704. The protection circuit consists of a series resistor 1601 having a very small value, such that the power dissipated through resistor 1601 is negligible compared with the power that goes to storage capacitor 207, and a bipolar transistor 1602 wherein the base terminal is connected to switch output 1405, the emitter terminal is connected to the input of diode 704, and the collector is connected to the input 1404 of MOSFET switch 905.

Figure 17:
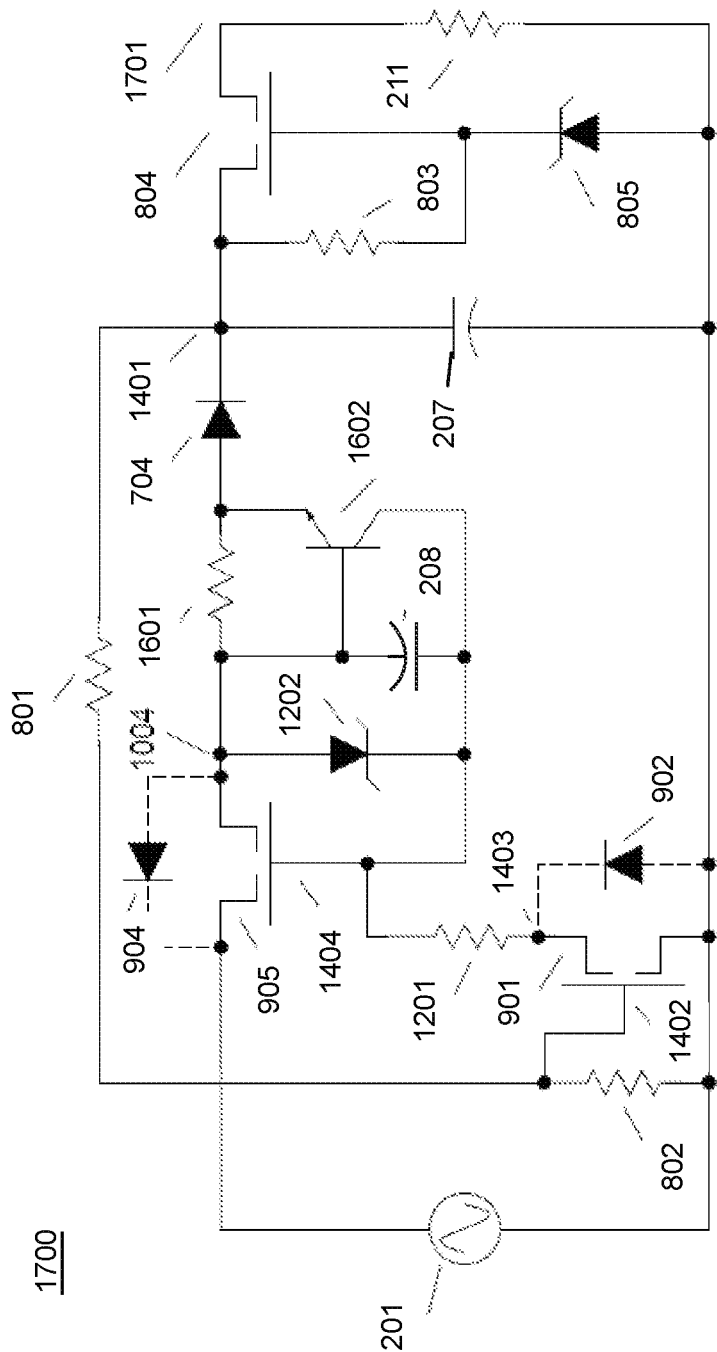
FIG. 17 is a schematic diagram of a preferred embodiment of the zero voltage switching circuit of FIG. 14 including output current limiting, output voltage regulation and negative feedback stabilization of the output voltage.

In a further embodiment shown in FIG. 17, the AC to DC converter 1700 includes the DC regulation circuit having elements 803, 804, 805 interposed between the former output terminal 1401 and the load 211 at the new DC output terminal 1701.

Figure 18:
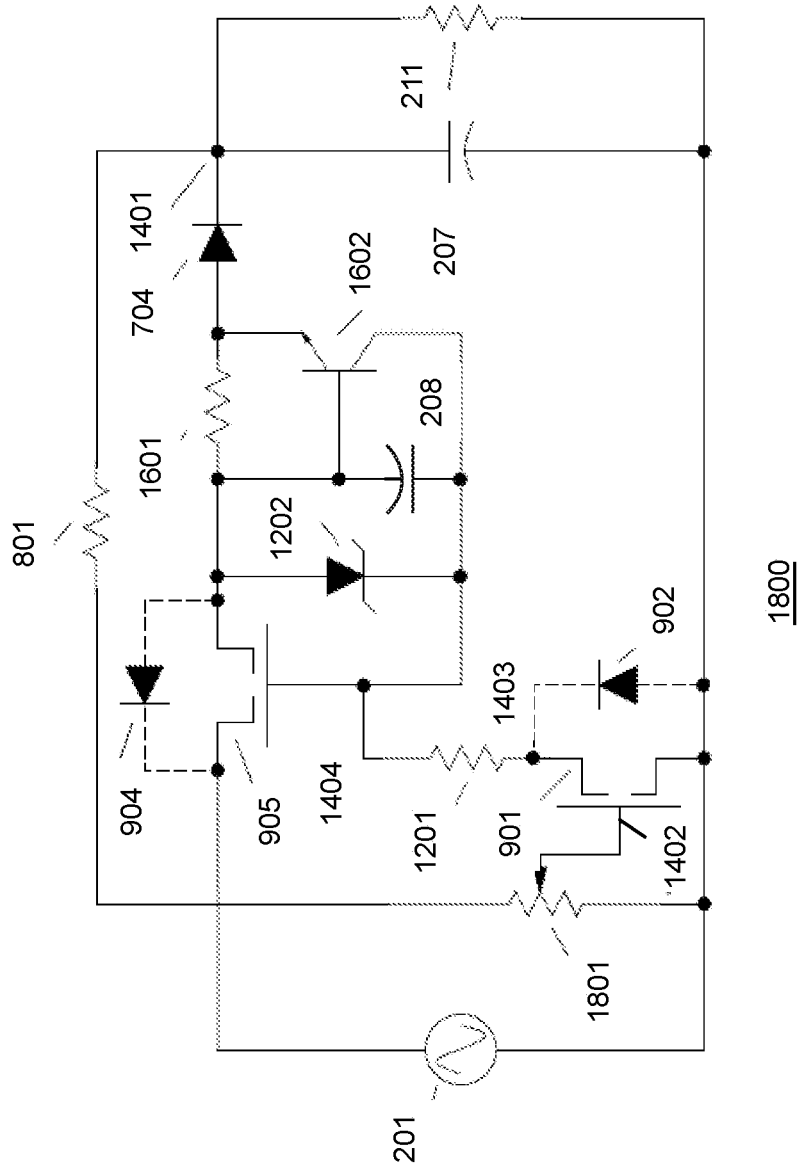
FIG. 18 is a schematic diagram of the zero voltage switching circuit of FIG. 17 in which the output voltage is manually adjustable.

FIG. 18 is a schematic diagram of an embodiment of the zero voltage switching circuit 1800 using MOSFETs in which the output voltage at the output terminal 1401 is adjustable. Resistor 802 in FIG. 17 is replaced with potentiometer 1801 which can be adjusted to change the reference voltage waveform applied to the gate 1402 of MOSFET 901, thereby changing the voltage stored on capacitor 207. In one embodiment the potentiometer is controlled by a microprocessor shown in later figures.

Figure 19:
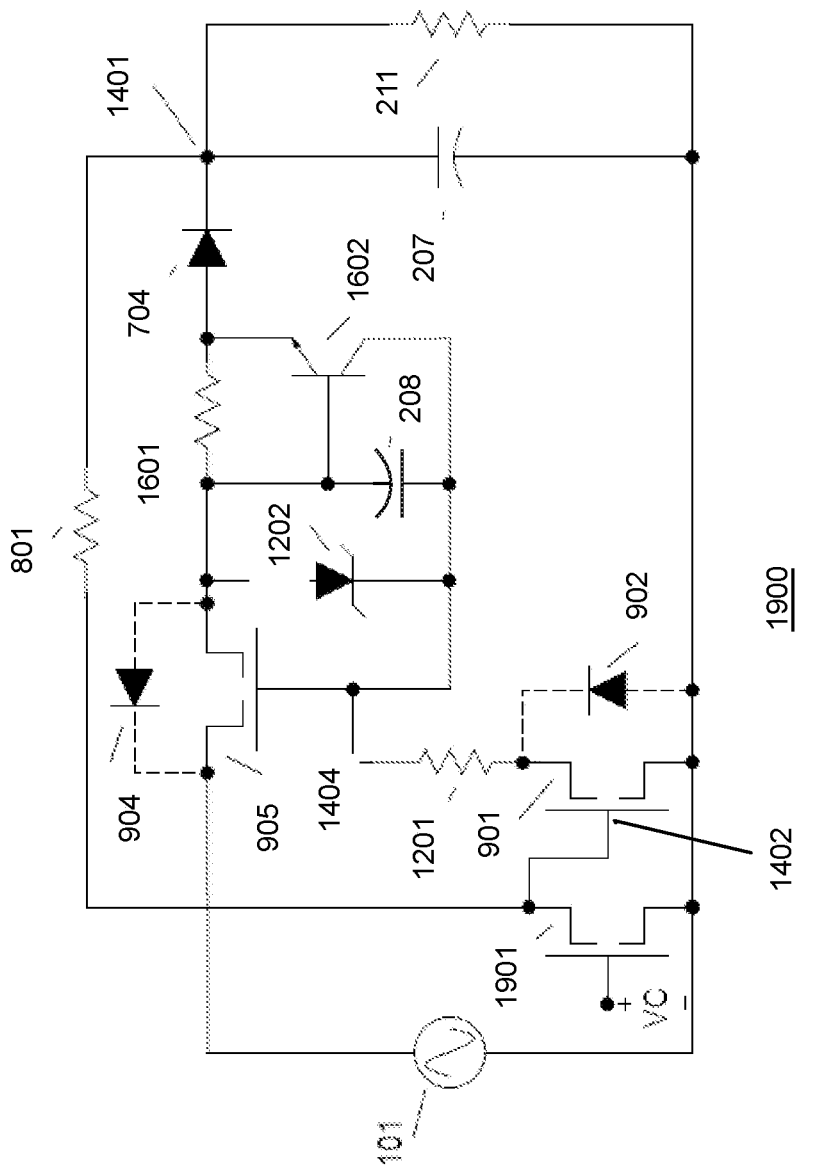
FIG. 19 is a schematic diagram of the zero voltage switching circuit of FIG. 17 in which the output voltage is electronically adjustable.

FIG. 19 is a schematic diagram of an embodiment of the zero voltage switching circuit 1900 using MOSFETs in which the output voltage of the AC to DC converter at the output 1401 is electronically adjustable. Additional control MOSFET 1901 is connected in place of resistor 802 in FIG. 17 and a DC control voltage, VC, is applied to the gate of MOSFET 1901, thereby changing the voltage applied to the gate 1402 of MOSFET 901 and changing the voltage stored on capacitor 207. In one embodiment the DC control voltage is provided by a microprocessor, shown in later figures.

Figure 20:
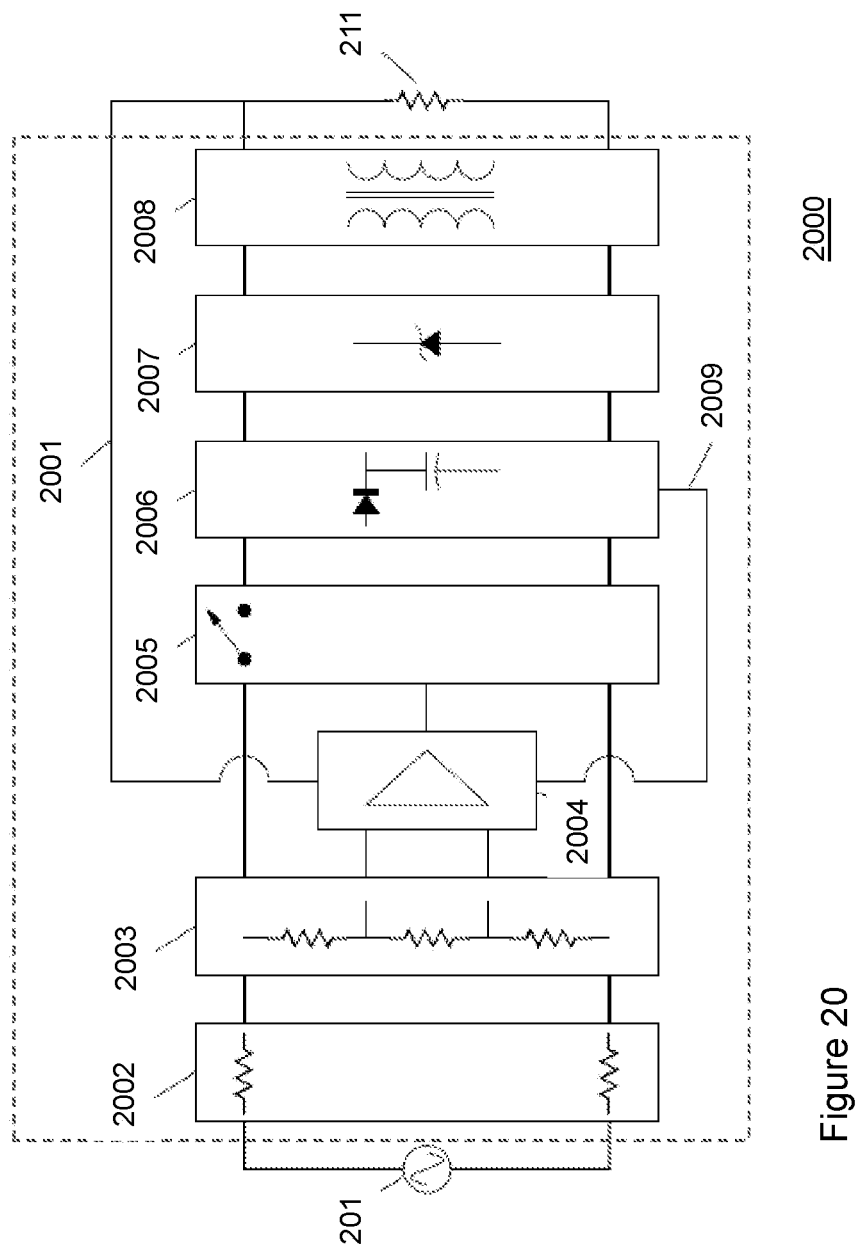
FIG. 20 is a block diagram of a third embodiment of the zero voltage switching circuit.
Figure 21:
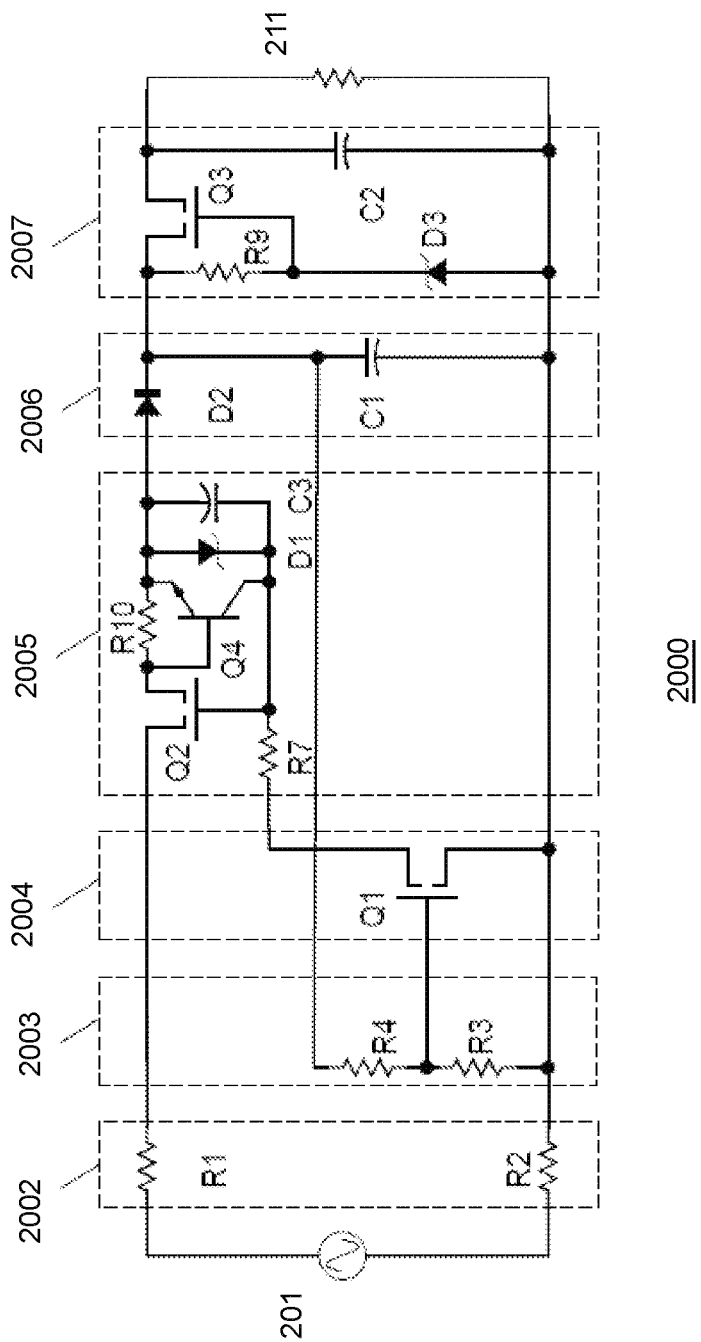
FIG. 21 is a schematic diagram of the embodiment of FIG. 20.

The AC to DC converter 2000 is comprised, generally, of the elements shown in FIG. and the method implied by these elements. A non-limiting specific example of the circuit elements is shown in FIG. 21. Referring to FIG. 20 the AC source 201 is connected to an inrush protection element 2002. In one embodiment the inrush element is comprised of resistor elements in the line and neutral of the AC supply. In another embodiment, where higher power and efficiency is required the inrush protection includes switch elements that provide high resistance at startup and switch the resistor elements out of the circuit at steady state operation. After the inrush protection, a scaled replica of the AC source 201 waveform is formed for control purposes using a sampling element 2003. In one embodiment the sampling element 2003 includes resistors configured into a voltage divider network. One embodiment is the voltage divider as shown and discussed in FIG. 17. In another embodiment the sampling element includes a reference voltage source as shown in FIG. 8. In the preferred embodiment, the sampling element and comparator are configured as shown in FIG. 17 with positive feedback 2001 from the output through to the comparator 2004 thereby creating a hysteretic comparator 2004. In another embodiment the sampling element 2003 can be manually adjusted as shown in FIG. 18. In another embodiment the sampling element can be electronically adjusted as shown in FIG. 19. The sampled voltages are used as input to a hysteretic comparator and switch driver element 2004. In the preferred embodiment, the switch driver element 2004 receives a feedback voltage signal 2009 from the storage element 2006 and based upon the voltage signal, controls the voltage applied to the gate of a switching element in the control switch and clamp element 2005, thereby opening and closing the control switch 2005 to supply power to the storage element 2006 and ultimately the load 211. In one embodiment, where the feedback 2009 is removed, the AC to DC converter is a feed forward converter where charging of the storage element 2006 is controlled from the forward side 2003, 2004 and 2005. Addition of the feedback control 2009 provides a means for both feed forward and feedback control. In one embodiment the balance of feed forward and feedback control is determined by the selection of components in the voltage sampling element 2003 and the feedback line 2009. In one embodiment the balance of feedforward and feedback control is determined by resistor elements in the sampling element 2003 and the feedback 2009. In another embodiment variable elements are used such that the feedforward and feedback control can be adjusted. In a preferred embodiment the hysteretic comparator and switch driver 2004 is comprised of a voltage divider and a MOSFET. The control switch, current limit and clamp element 2005 controlled by the switch driver 2004 provides pulsed power at a fixed maximum current to the storage element 2006. In the preferred embodiment the switch, current limit and clamp element 2005 comprises an N-MOSFET, a current sensing resistor and a bipolar peak current limiting transistor, and a Zener diode, connected source to gate that clamps the peak gate-to-source voltage on the negative half-cycle of the AC source 201, thereby providing the zero voltage switching feature of this circuit. Power from the switch and clamp element comprised of pre-selected peak current pulse is provided to a storage element 2006. In one embodiment voltage on the storage element 2006, comprised of a capacitor used as an energy storage element and a diode, is fed back 2009 through a voltage divider circuit to the switch driver 2004 thereby maintaining a constant charge on the capacitor. Output from the storage element is fed through a voltage regulator 2007 to the load 211. In another embodiment the AC to DC converter further includes a galvanic isolation element 2008. In another embodiment the AC to DC converter further includes elements 2001 that enable feedback from the load 211. In the preferred embodiment the feedback circuit 2001 also includes galvanic isolation (not shown, but equivalent to item 2008) between the control element 2004 and the load 211.

FIG. 21 shows the preferred embodiment of the zero voltage switching AC to DC converter 2000. The individual components of the circuitry work much as the components of the circuitry already described in FIGS. 9-19. The AC source 201 is connected to the inrush protection circuit 2002 comprised in this preferred embodiment of resistors R1 and R2. In another embodiment (not shown) the inrush protection includes switches such that the current flows through the resistors R1 and R2 at startup and bypasses the resistors once steady state operation is reached. In another embodiment the inrush control uses inductors; that is elements R1 and R2 are replaced with inductors L1 and L2. Output from the inrush protection goes to the switch Q2 of the switch, current limit and clamp circuit 2005 and to the voltage sampling element 2003. The voltage sampling element 2003 is comprised of resistors R3, R4, sampling the voltage from storage capacitor C1, 2006. The values of R3, R4 are selected such that the voltage to the gate of switch Q1 in the switch driver element 2004 turns switch Q1 on and off and thereby synchronously turns switch Q2 off and on thereby providing a preselected timed output pulse from switch Q2 to charge storage element C1. Resistor R4 provides a feedback path as to the charge on capacitor C1 and therefore the output voltage to the voltage sampling circuit 2003 and therefore to the control circuit 2004. The switch, current limit and clamp element 2005 is comprised of switch Q2, current sense resistor R10 and bipolar transistor Q4, Zener Diode D1, capacitor C3 and resistor R7. The switch Q2 is controlled by the switch driver circuitry 2004. The peak output current of switch Q2 is limited to a preselected maximum value based upon the selected value of the current sense resistor R10. Capacitor C3 is charged to the Zener voltage of diode D1 on the negative half-cycle of the AC source 1701 and provides the gate-to-source bias on Q2 that minimizes the drain-to-source voltage of Q2 during the charging current transient. This pulsed output from the switch Q2 is connected to the voltage regulator 2007 which through the feedback of R4 to the voltage sampling 2003 and the switch driver 2004 holds storage capacitor C1 to a constant charge. Control element switch Q1 and therefore supply switch Q2 are activated, either opened or closed, in synch with the AC input 201. The AC to DC converter provides a low voltage output with pulse modulation at the frequency of the incoming AC source. The switches are activated, either opened or closed, at voltages that are near, within the threshold values for the components Q1 and Q2, of the zero crossing of the AC source. The Output then goes to voltage regulator 2007 and then load 211. The voltage regulator 2007 includes switch Q3, Zener diode D3 resistor R9 and capacitor C2. Circuit components D3, Q3, R9 function as a voltage regulator equivalently to that already described for circuit elements 803, 804, 805 respectively in FIG. 8. Capacitor C2 provides storage capacity to buffer and thereby smooth the output from the AC to DC converter to the load 211.

The AC to DC converter in the preferred embodiment of FIGS. 20 and 21 is comprised of elements of inrush protection 2002, voltage sampling 2003, a hysteretic comparator and switch driver 2004, a switch and clamp 2005, a storage element 2006 and a voltage regulator 2007. Selection of components in the voltage sampling 2003 determine the timing of the comparator and switch driver 2004. Selection of elements in the switch and clamp determine a peak voltage and current limit for out pulses. Power output is controlled by selection of both the peak current and the pulse timing. Feedback from the storage element through the voltage sampling is used to select the pulse timing. The AC to DC converter 2000 operates in sync with the AC source 201.

Figure 22:
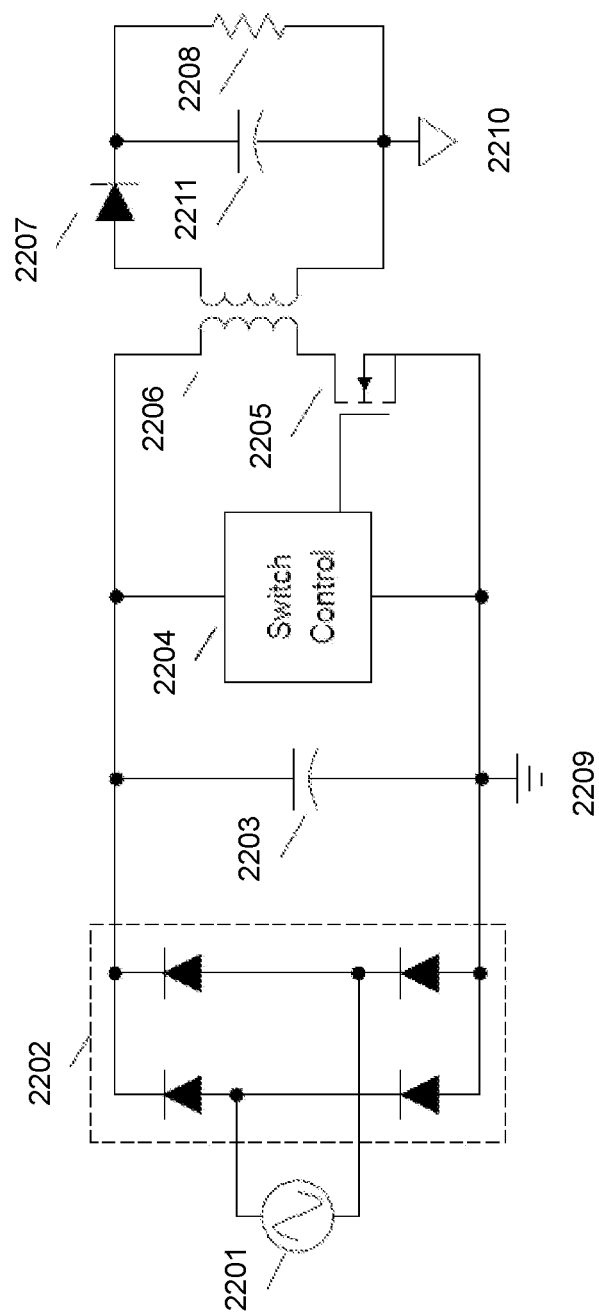
FIG. 22 shows prior art for an AC to DC converter that includes isolation of the load from the source.

FIG. 22 shows an AC to DC converter system that includes prior art Galvanic isolation of the AC source 2201 from the load 2208. The typical prior art AC to DC converter includes full wave rectification 2202 that provides a grounded 2209 DC source that is filtered 2203 includes a controller 2204 that is typically a pulse controller that uses a switch 2205 to control the output through a transformer 2206 thereby providing DC voltage to the load 2208. Diode 2207 prevents flow of current from the load back through the transformer 2206. Typically, the transformer also acts as a step down transformer to control the voltage required by the load 2208. Note that the high side of the transformer 2206 operates at the rectified voltage of the AC source 2201. Although the transformer does provide galvanic isolation the high voltage connected to the transformer thereby requires a transformer that can operate with this high voltage.

Figure 23:
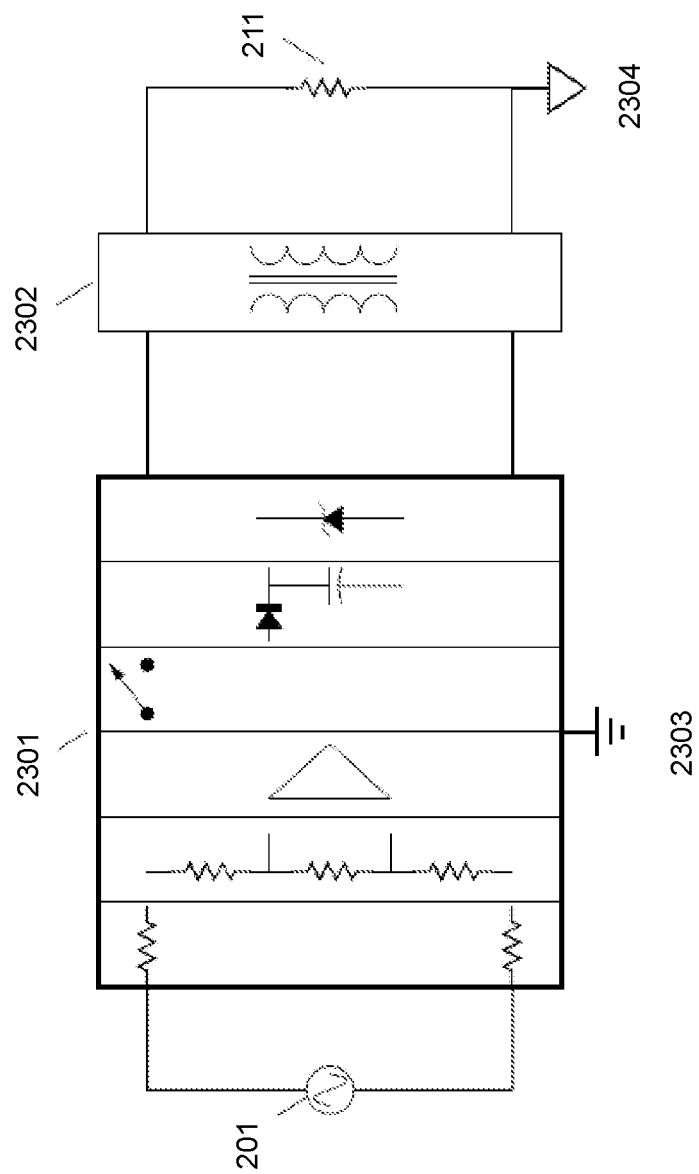
FIG. 23 shows an embodiment of an AC to DC converter of the present invention that includes isolation of the load from the source.

By contrast the power supply of the instant invention is shown in a first embodiment of FIG. 23. The AC source 201 is connected through the AC to DC converter 2301 through an isolation device 2302 to the load 211. The ground 2303 on the AC to DC converter 2303 is not necessarily at the same level as the ground 2304 on the load 211. In a preferred embodiment the AC to DC converter 2301 is as described in FIGS. 16 through 21. The AC to DC converter 2301 includes clamping of the output voltage supplied to a storage capacitor (C1 of FIG. 21) such that the isolation device 2302 sees at most the clamped voltage. In a preferred embodiment and comparison of FIGS. 20 and 23 the isolation device is located between after voltage regulator 2007 and the load 211. In one embodiment the isolation device 2302 is an electro-optic isolation device integrated on the same silicon as the AC/DC converter. In another embodiment the isolation device 2302 is a galvanic isolation device located external to the AC/DC converter 2301 integrated on silicon and the load 211.

Figure 24:
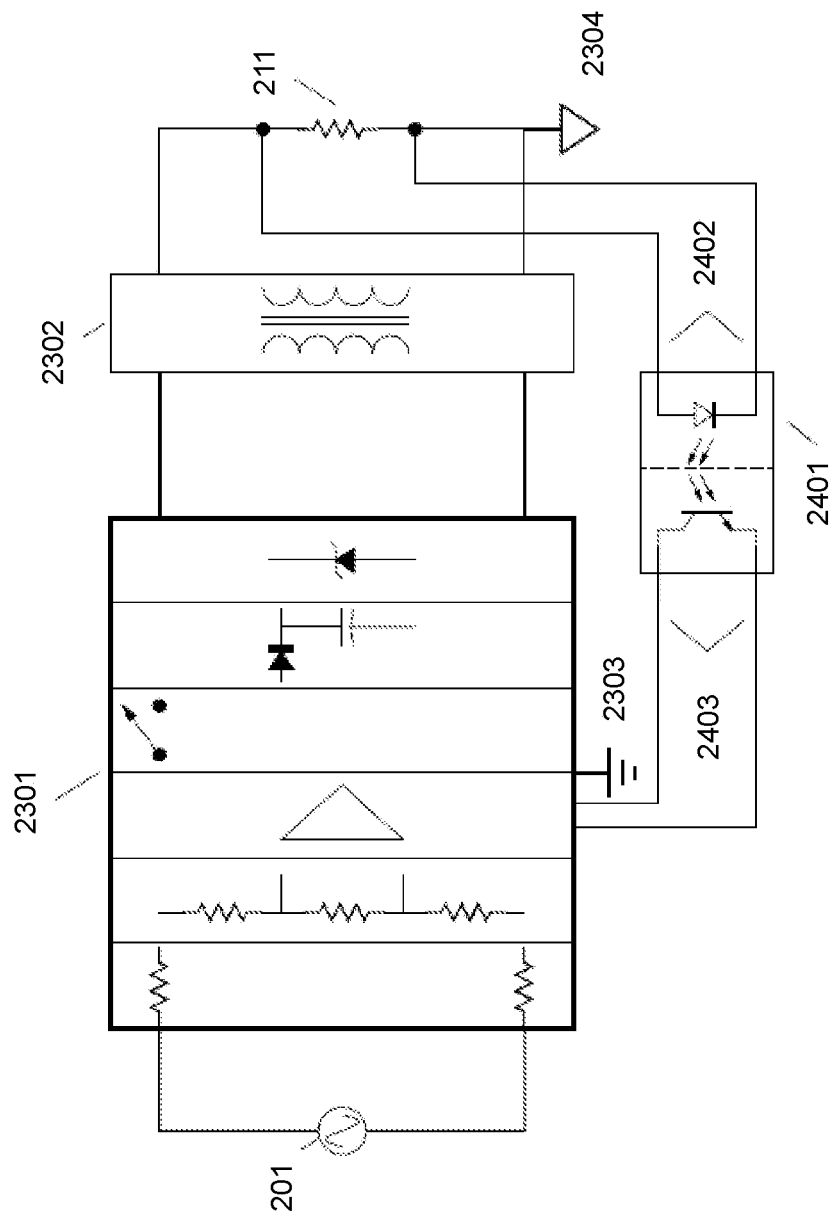
FIG. 24 shows an embodiment of an AC to DC converter of the present invention that includes isolation of the load from the source and further includes feedback control from the load to the AC to DC converter.

Another embodiment, shown in FIG. 24, further includes isolated feedback from the load 211 to the AC to DC converter 2301. The feedback is provided through sense lines 2402 that pass through an isolator 2401 and through the isolated sense lines 2403, to the AC to DC converter. In one embodiment one of the sense lines 2403 is grounded and the other feeds into the voltage sampling circuit 2003 (FIG. 20) much as the sense line 1209 shown in FIG. 20. In one embodiment the isolator 2401 is an optical isolator as shown in the FIG. 24. In another embodiment (not shown) a transformer is used for the isolator in place of the optical isolator. In the preferred embodiment the isolator 2401 is integrated onto silicon with the AC/DC converter 2301.

FIGS. 20, 21, 23 and 24 show an AC to DC converter that may be fully integrated on silicon. Not all of the components shown in the figures are required for a fully functional device. In one embodiment, the AC to DC converter 2000 consists of a voltage divider 2003 connected to and sampling the AC source 201 and further connected to the base of first switch transistor, Q1. The values of the resistor in the voltage divider control the voltage seen by Q1 and thereby provide feed forward control of Q1 and therefore the output of the AC to DC converter. The drain of Q1 is in turn connected to the base of a second switch transistor, Q2 which supplies pulsed current to a storage device C1. A diode D2 prevents discharge of the capacitor C1 back through the switch Q2. A sense line is connected from the storage element C1 through a resistor R8 into the voltage divider 2003 and provides feedback control to prevent full discharge of the storage capacitor C1. A Zener diode D1 connected between gate and source of Q2 clamps the gate-to-source voltage seen by Q2 to the Zener voltage of the diode D1, which bias voltage is stored on capacitor C3. An inductor or low resistance wire wound resistor R1 in series in the AC line, filters transients and limits current seen by Q2. Therefore, a fully functional AC to DC converters is seen to consist of a voltage divider, two switches, a storage device, a Zener diode, a regular diode, and an inductor, wherein the switches are N-MOSFETs and the storage device is a capacitor. In another embodiment the AC to DC converter further includes inrush control 2002. In one embodiment the inrush control consists of a resistor connected in series in the line and neutral of the AC source. In another embodiment the AC to DC converter further consists of a voltage regulator. In one embodiment the voltage regulator consists of a switch Q3 connected in output line from the storage device C1. The switch is controlled through a Zener diode D3 connected to its base from a capacitor C2. The output of the voltage regulator is connected to the load 211. In another embodiment the AC to DC converter further incudes galvanic isolation, wherein the galvanic isolation is an isolation transformer connected to the output of the voltage regulator. In another embodiment there is no voltage regulator and the isolation transformer is connected between the storage capacitor C2 and the load 211. Another embodiment further includes feedback from the load to the voltage divider 2003. The feedback from the load is fed through a second isolation device 2401 to the voltage divider 2003

The Switch

Figure 25:
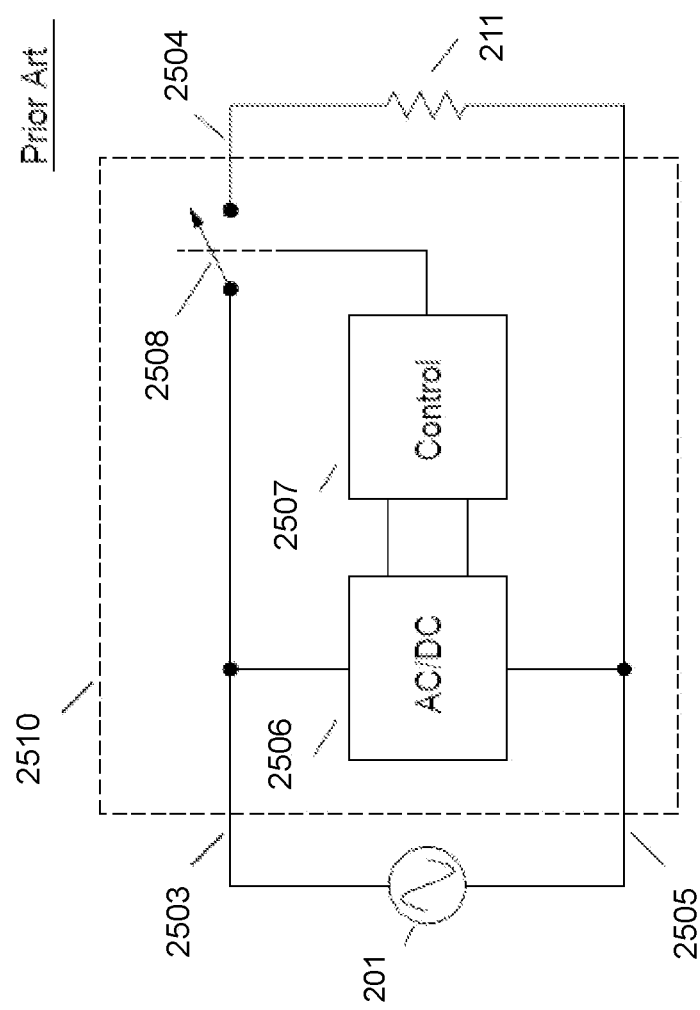
FIG. 25 is a block diagram of a basic prior art three-wire switch/dimmer circuit.

In conjunction with the AC/DC converter as described above, a high efficiency, integrated, switchable and programmable power supply on a chip further requires a high speed, low energy requirement, bidirectional switch that can be configured into either a three wire or two-wire configuration. FIGS. 25-33 describe such a device. FIG. 25 is a block diagram of a basic three-wire switch/dimmer unit 100 employing solid-state switch devices. AC mains source 201 provides hot 2503 and neutral 2505 input connections through switch/dimmer circuit 2510 to load 211 through load 2504 and neutral 2505 output connections. Switch device 2508 is driven by switch control circuit 2507 which is provided with DC power by AC/DC power supply 2506. In switch mode continuous DC bias is applied by the control circuit 2507 to switch device 2508 to maintain closure. In dimmer mode the operating bias is provided by the control circuit 2507 as pulses that are synchronized with the AC mains 201 waveform wherein the duty cycle of the pulses establishes the percentage of total power applied to the load. For dimmer operation, the controller 2507 comprises pulse generation circuitry and synchronization with the AC mains as is known in the art. The controller may also include the user interface to input desired power to be applied to the load. In one embodiment the user interface is physically incorporated into the control circuit 2507. In another embodiment the control circuit includes wireless communication circuitry and the user interface is located physically remote from the control circuit 2507. Note that a minimum of three connections (2503-2505) are required to install the switch and control unit.

Figure 26A:
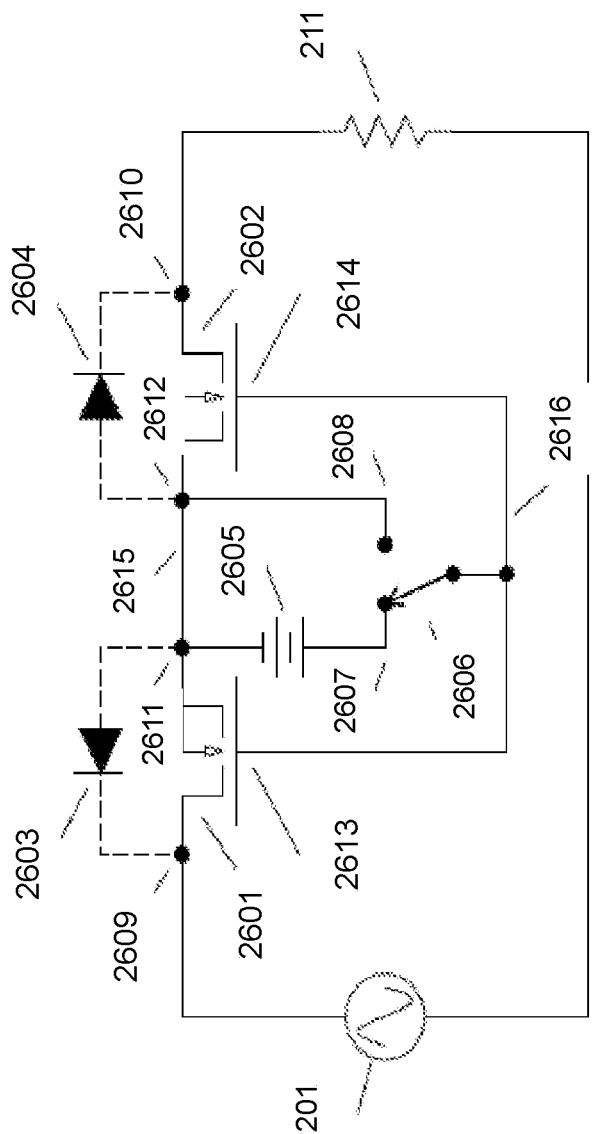
FIG. 26A is a schematic diagram of the basic elements of the prior art bidirectional switch.

FIG. 26A is a schematic diagram of the basic elements of the prior art bidirectional switch 2508 using power MOSFET devices to create a bidirectional electronic switch controlling the power delivered from AC source 201 to load 211. Power MOSFETs 2601 and 2602 include body diodes 2603 and 2604, respectively. Switch 2606 controls the gate-to-source bias voltage applied to power MOSFETs 2601 and 2602. In the "on" 2607 position bias voltage 2605 is applied to the gate terminals 2613, 2614 of the power MOSFETs 2601 and 2602. Voltage 2605 is a voltage greater than the threshold voltage of the power MOSFETs (typically 5 to 10 volts) causing an inversion layer to form thereby creating a conducting channel extending from the drain 2609, 2610 to the source 2611, 2612 of each device. In this "on" state, the drain-to-source behavior of each power MOSFET can be modeled as a low value resistor, Rds. As long as the voltage drop between drain and source remains below about 0.6 volt, the body diodes remain nonconductive and can be neglected. In the "on" state the circuit of FIG. 26A is equivalently the load 211 connected to AC source 201 through a series resistor having value 2Rds.

In the "off" 2608 position of switch 2606 the gate terminals 2613, 2614 of the power MOSFETs 2601, 2602 are shorted to the source terminals 2611, 2612 and the drain-to-source conducting channels vanish as long as the drain-to-source voltage remains below the breakdown voltage of the body diodes. In the "off" state the circuit is equivalently the load 211 connected to AC source 201 through back-to-back body diodes 2603 and 2604, which effectively disconnects the load 211 from source 201.

The requirement that the drain-to-source voltage of the power MOSFETs remain below the breakdown voltage of the body diodes, Vbr, in the "off" state requires that the breakdown voltage of the body diodes exceed the peak voltage of AC source 201. Thus, for example, assuming that source 201 corresponds to a common 120 volt (rms) AC mains, then the breakdown voltage of each body diode must exceed the peak source voltage of 170 volts.

A more detailed analysis of the power MOSFET structure shows that the body diode is effectively the base-collector junction of a bipolar transistor connected in parallel with the MOSFET channel. Additional parasitic elements include the capacitance of the base-collector junction and a parasitic resistance between the base and the emitter. This AC-coupled circuit places a constraint on the rate of change of the drain-to-source voltage, dVds/dt, to avoid forward biasing the base-emitter junction, thereby causing the bipolar transistor to conduct while the MOSFET channel is "off". While the resulting leakage current may not be sufficient to energize the load 211, it may be large enough to cause efficiency or safety concerns.

Similarly, consideration of the constraints in the "on" state require that the drain-to-source voltage drop for each power MOSFET given by Rds*Iload be less than about 0.6 volts. Potentially more important is the power dissipated in each power MOSFET in the "on" state given by Rds*Iload2 which must remain less than a few watts to avoid excessive temperature rise. Thus, for example, switching a common household circuit from a 120 volt AC mains having a typical limit of 20 amperes requires that Rds for each power MOSFET be less than 0.005 ohms (5 milliohms.) It is well known in the art that the breakdown voltage of the body diode can be advantageously traded off against the value of Rds by varying the structure and the doping levels in the device. In particular, it has been shown that the value of Rds is proportional to Vbr2.5. Thus, for example, cutting Vbr in half results in reducing Rds by a factor of 5.7.

The circuit of FIG. 26A shows that the conceptual bias switching circuit, comprising switch 2606 and voltage source 2605, floats electrically with the common source terminals of the back-to-back power MOSFETs 2601 and 2602 which vary in voltage across the entire peak-to-peak range of source 201. Although simple in concept, this floating bias circuit can be difficult to realize in practice at low cost.

Figure 26B:
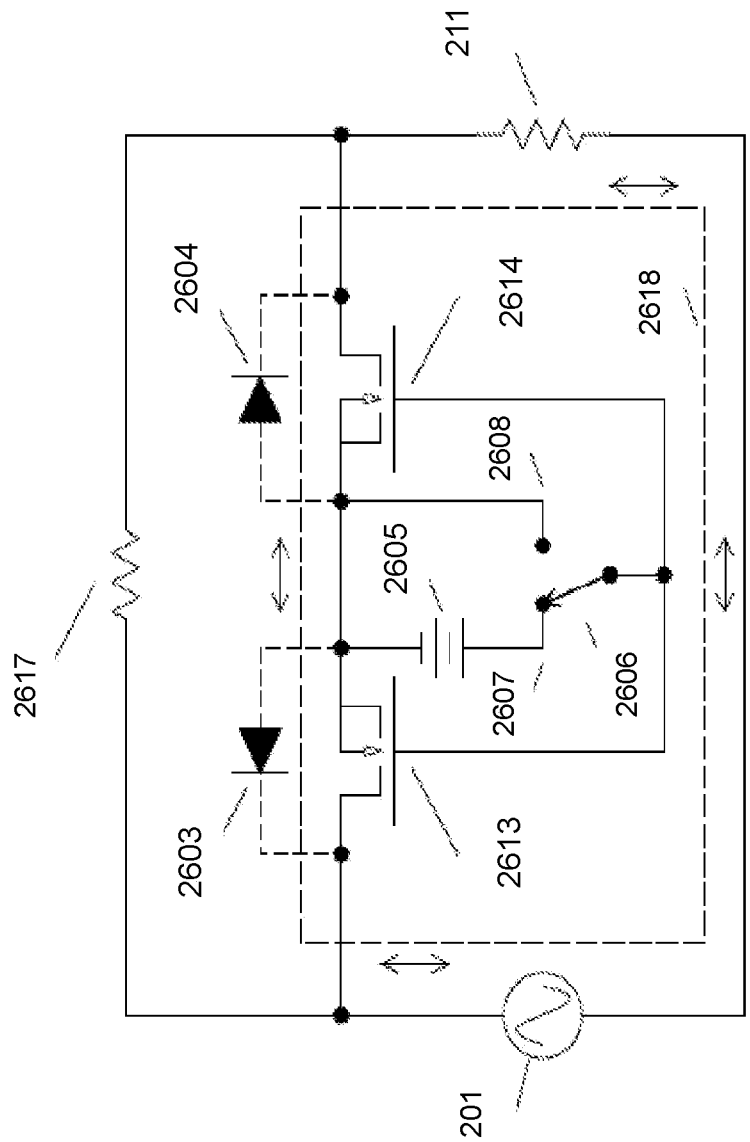
FIG. 26B is a modification of the circuit of FIG. 26A including an additional load across the switch devices.
Figure 26C:
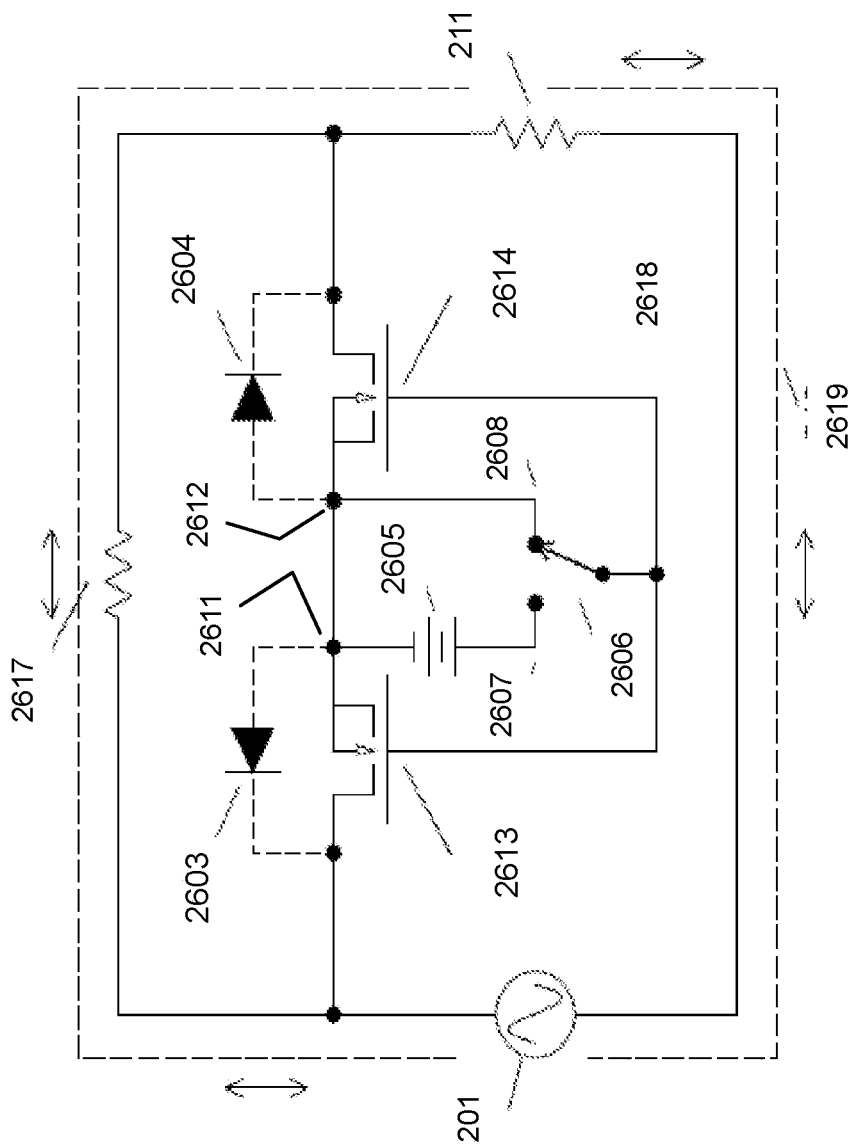
FIG. 26C is the circuit of FIG. 26B showing current through the additional load when the switch devices are "off."

FIG. 26B shows a modification of the circuit of FIG. 26A in which additional load device 2617 is connected in parallel with power MOSFETs 2601 and 2602, with control switch 2606 in the "on" position 2607 connecting the power MOSFET gates 2613, 2614 to voltage 2605. Current flows from AC source 201 through the power MOSFET channels to load 211, effectively bypassing the additional load device 2617 following the path 2618. FIG. 26C shows the circuit of FIG. 26B when control switch 2606 is moved to the "off" position 2608, connecting the power MOSFET gate electrodes 2613, 2614 to the source terminals 2611, 2612. In this case the power MOSFET devices are nonconducting and current flows from AC source 201 through additional load 2617. Current follows path 2619 flowing through additional load 2617 and load 211 and returning to AC source 201. Thus, the bidirectional switch circuit acts like a two-pole switch, supplying full current to the load 211 when the power MOSFETs are "on" and reduced power to the additional load 2617 when the power MOSFETs are "off".

Figure 27:
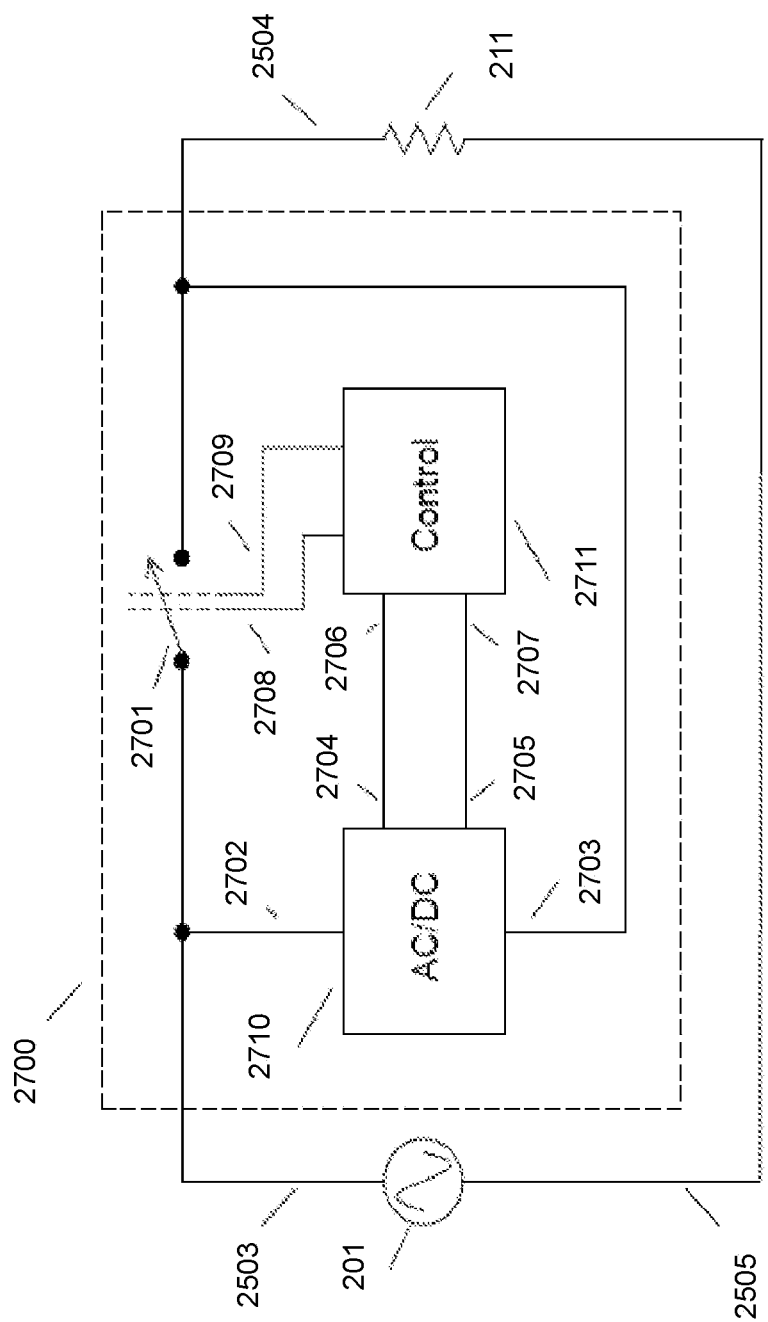
FIG. 27 is a block diagram of an embodiment of a two-wire switch.

FIG. 27 is a block diagram of an embodiment of a two-wire bidirectional switch 2700. In contrast to FIG. 25, the switch 2700 requires only two wires 2503, 2504 for connection and operation. The electronic switch element 2701 connects the AC mains 201 to the load 211 that is external to the switch 2700. AC power is provided to AC/DC converter 2710 via supply lines 2702, 2703 and filtered and regulated DC power is supplied to subsequent control circuitry 2711 via DC output lines 2704, 2705. Control circuit 2711 is supplied with DC power via input lines 2706, 2707 and control signals for controlling the state of switch 2701 is provided via control lines 2708, 2709. As in the circuit of FIG. 25, in phase control mode the operating bias for switch 2701 is provided by the control circuit 2711 as pulses that are synchronized with the AC mains 201 waveform wherein the duty cycle of the pulses establishes the percentage of total power from source 201 applied to the load 211. In a continuous full power operation, in an on/off mode, requires that switch 2701 be opened periodically to refresh the AC/DC power supply 2710 which must incorporate sufficient energy storage to provide operating DC power between refresh operations. The AC/DC power supply 2710 is as described previously in FIGS. 5-24.

FIG. 25 as discussed above, shows a block diagram of an embodiment of a three-wire switch circuit that functions as a power supply circuit 2510 using the AC/DC power supply 2506 as previously described to supply power to the switch control circuit 2507. The switch 2508 controls power supplied from the AC source 201 to the load 211.

Figure 28:
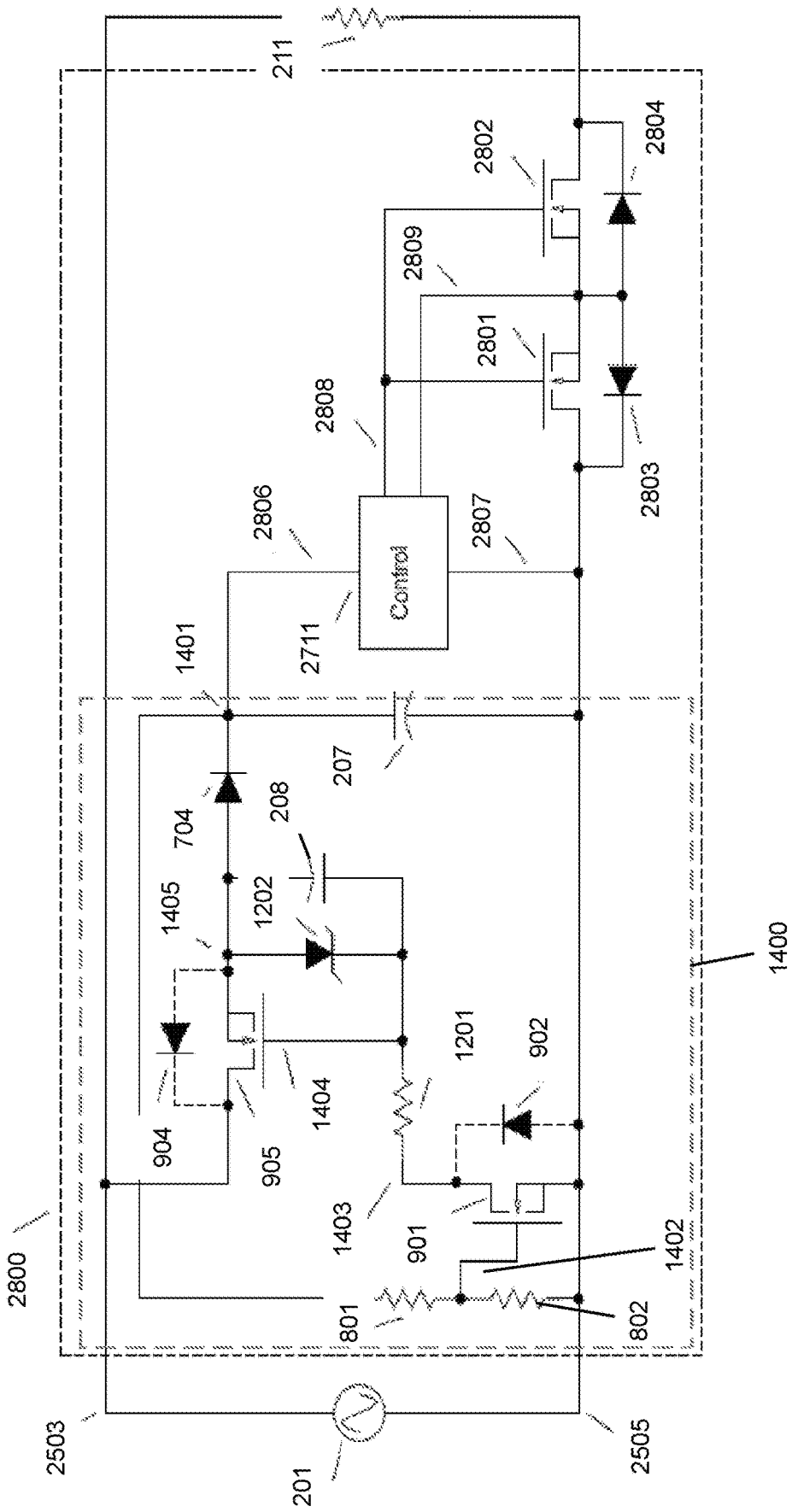
FIG. 28 is a schematic diagram of an embodiment of the three-wire switch circuit.

A detailed improved three wire embodiment of an AC power supply circuit is shown in FIG. 28. The three-wire AC power supply circuit 2800 comprises power MOSFETs 2801 and 2802, including body diodes 2803 and 2804, respectively and is relocated to the AC mains 201 neutral line 2505 to allow for the control voltage levels provided by the AC/DC power supply. The function of switch 2606 in FIG. 26 is accomplished directly using control circuit 2711 which provides floating control outputs 2808 and 2809 and is powered by the AC/DC power supply circuit 1400 (dashed lines enclosure) through lines 2806, 2807. The AC/DC converter is as shown in FIG. 14 and already discussed.

Figure 29:
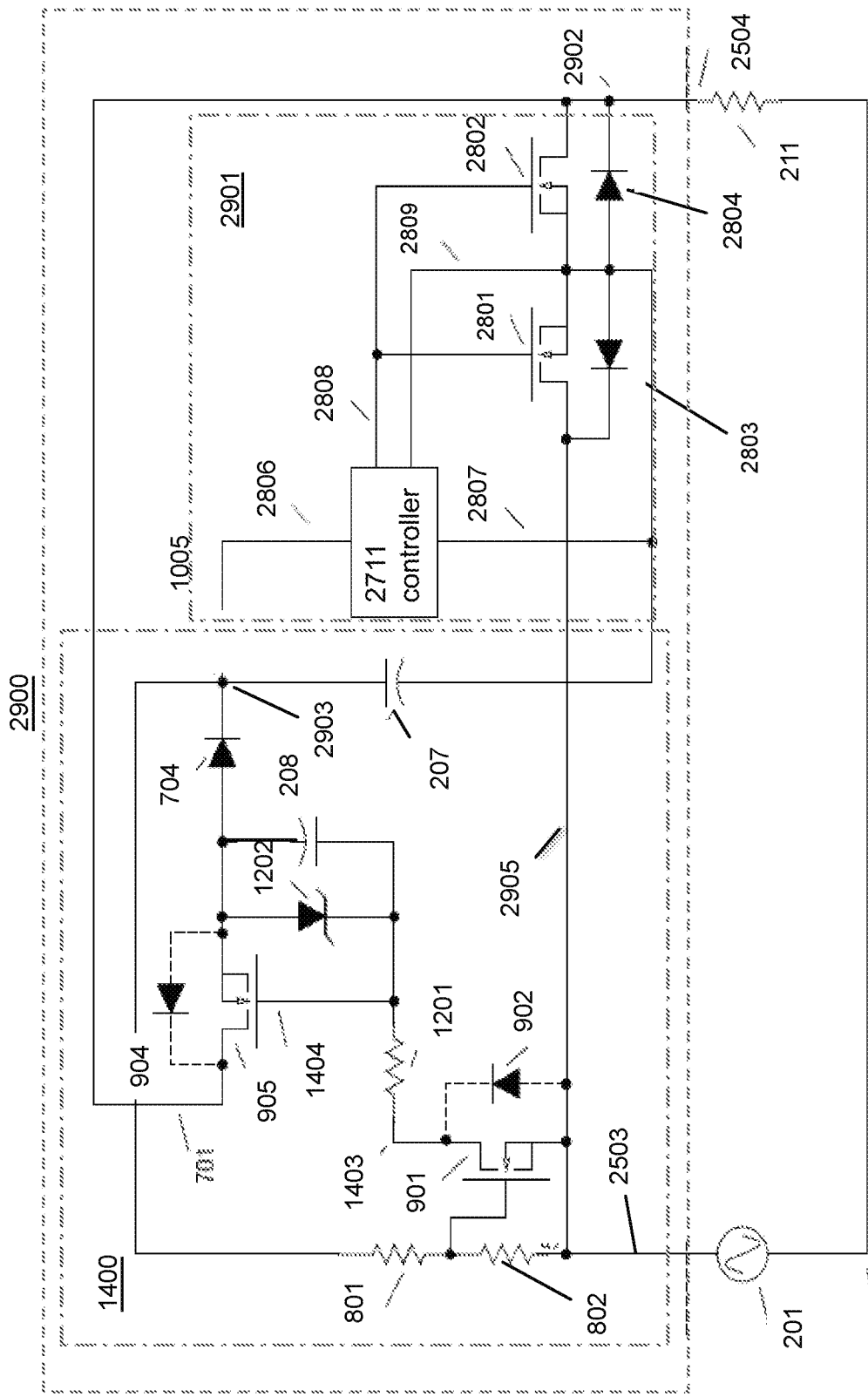
FIG. 29 is a schematic diagram of the embodiment of FIG. 28 wherein the elements have been reconnected to produce a two-wire switch circuit.

FIG. 29 is a schematic diagram of the embodiment of FIG. 28 wherein the elements have been alternatively connected to produce the two-wire circuit 2900. The new configuration primarily involves reconnecting the hot lead 2503 of AC source 201 to what had formerly been the neutral line 2505 connection to the AC/DC 1400, reconnecting the load from what had formerly been the AC mains 201 hot lead 2503 to the AC mains 201 neutral lead 2505, reconnecting the drain 1402 of MOSFET 901 to bidirectional switch output node 2902, and separating the floating neutral 2903 line having connections to capacitor 207, the control circuit 2711, and the common source connections of the MOSFET switch devices 2801 and 2802, from what had been the AC mains 201 neutral line 2505. Control circuit 2711 provides floating control outputs 2808 and 2809 to control bidirectional switch comprising MOSFETS 2801, 2802.

In summary, FIG. 29 shows a two-wire bidirectional switch system 2900 for switching current in an alternating current (AC) circuit between an AC source 201 and a load 211, the load connected between a neutral terminal 2505 of AC source 201 and the output 2902 of the bidirectional switch. The system 2900 comprises an AC/DC converted 1400 and a bidirectional switch 2901. The system is located between the AC Source 201 and The load 211 on a single side 2503 of the AC Source and the load. The load is further connected between the bidirectional switch 2900 and the other connection 2505 to the AC source 201.

One embodiment of a bidirectional electrical switch 2900 comprises:
 a. an AC to DC conversion system 1400 having a first input terminal 2503 from the AC source 201 in a direct current (DC) and first 2806 and second 2807 output terminals connected to a control circuit system 2711 of a bidirectional electronic switch 2901, and
 b. the control circuit system 2711 having first 2808 and second 2809 output terminals for providing control signals to an electronic switch, and
 c. the electronic switch 2902 connected between the input terminal 103 from the AC source 201 and the bidirectional switch output terminal 104; wherein the state of the control signal appearing between control system output terminals 408, 409 determines the state of the switch.

Figure 30A:
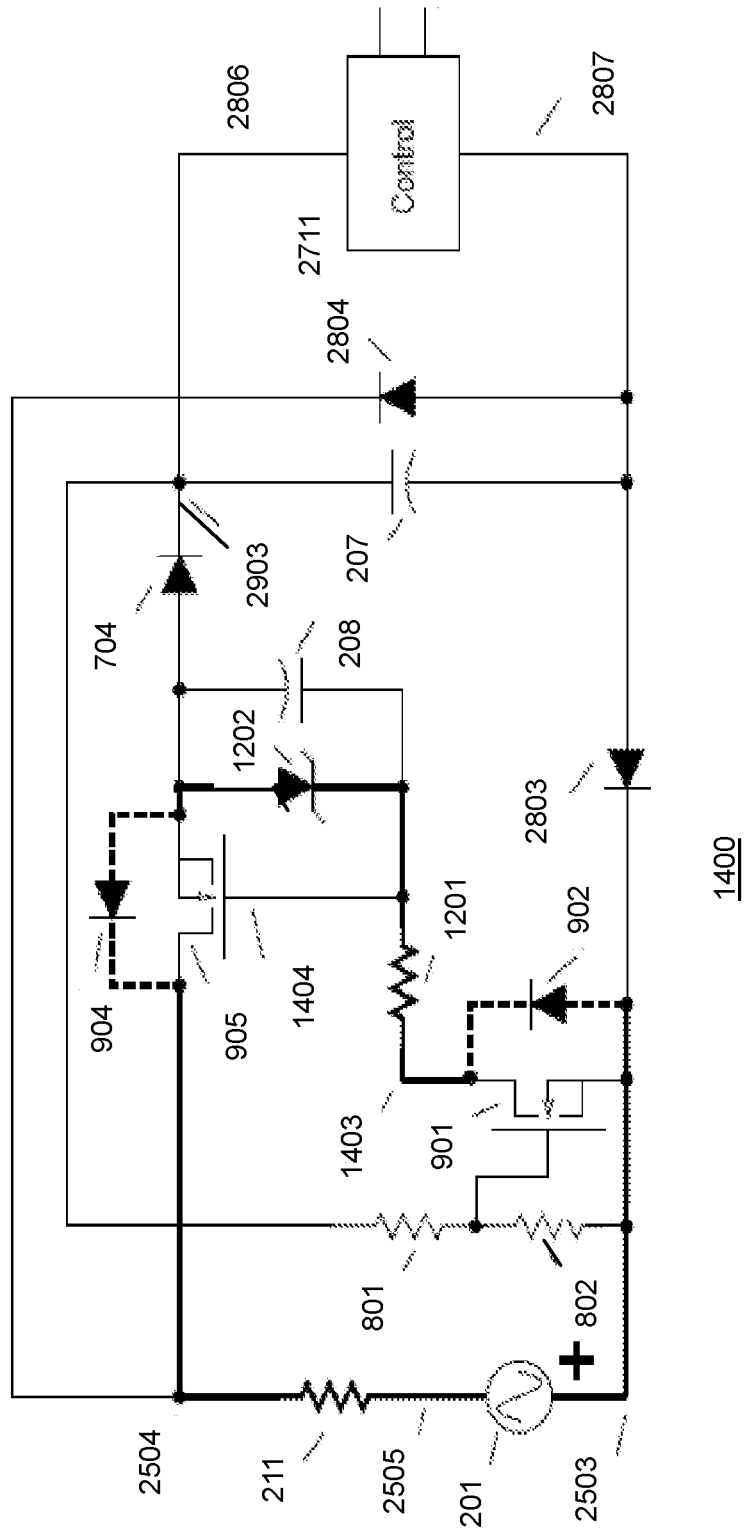
FIG. 30A shows effective configuration of the circuit of FIG. 29 when the MOSFETs in the bidirectional switch are "off" and the neutral line is positive with respect to the hot line.

The control circuit 2711 requires a constant power source through leads 2806, 2807 in conditions when the electronic switch 2901 is in both the "on" state and the "off" state. Power is supplied by the AC/DC converter 1400. FIG. 30A shows the effective configuration of the AC/DC 1400 circuit of FIG. 29 when the bidirectional switch circuit 2901 is "off" and the AC mains 201 hot line 2503 is positive with respect to the AC mains 201 neutral line 2505. Current flows through body diode 902, current limiting resistor 1201, the parallel network consisting of Zener diode 1202 and capacitor 208, and back to AC mains 201 through body diode 904 and load 211. This charges capacitor 208 to the Zener voltage which is selected to exceed the threshold voltage of switch MOSFET 905 sufficiently to ensure that it is fully on when the polarity of the AC mains 201 reverses.

Figure 30B:
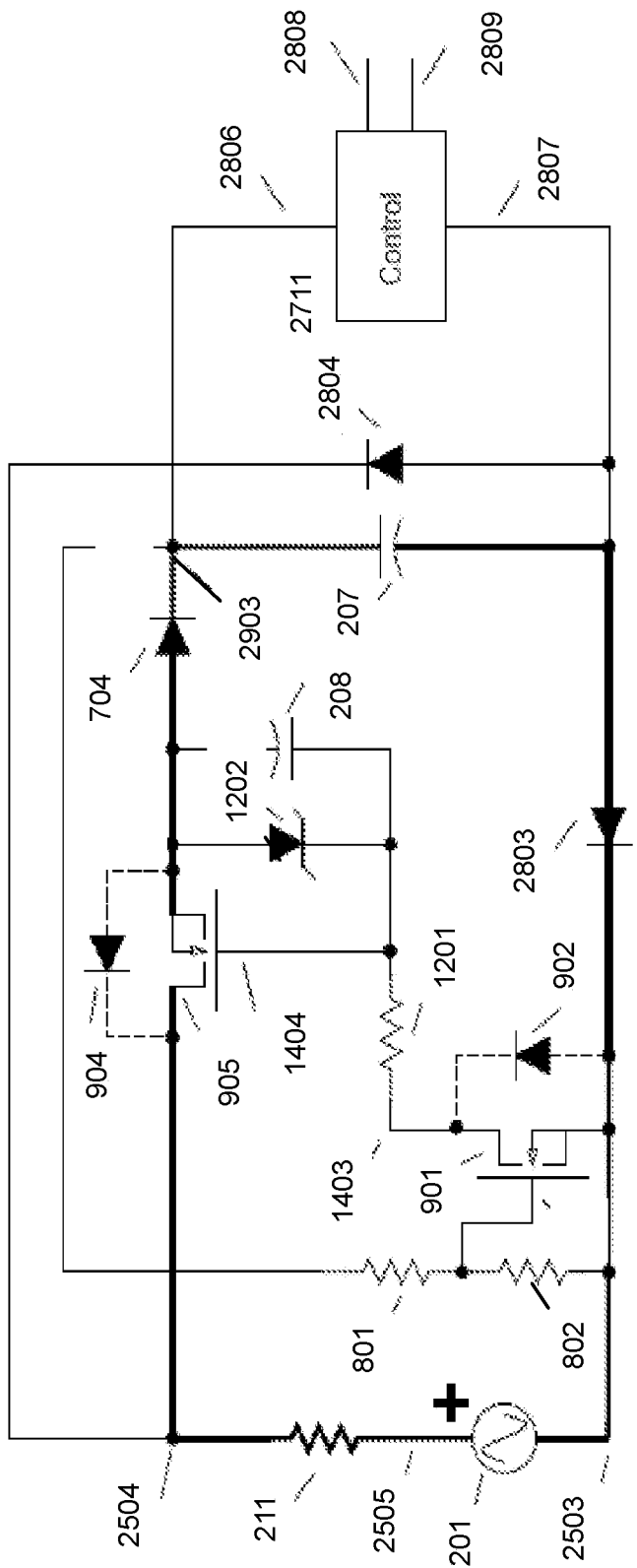
FIG. 30B shows effective configuration of the circuit of FIG. 29 when the MOSFETs in the bidirectional switch are "off" and the hot line is positive with respect to the neutral line.

FIG. 30B shows the effective configuration of the circuit of FIG. 29 when the MOSFETs in the bidirectional switch are "off" and the AC mains 201 neutral line 2505 is positive with respect to the AC mains 201 hot line 2503. Current flows through load 211, through the channel of MOSFET 506 and through peak detect diode 207, charging capacitor 208 to the voltage determined by the threshold voltage of MOSFET 503 and the voltage divider comprising resistors 501 and 502, returning to AC mains 201 through the forward biased body diode 303.

Figure 31:
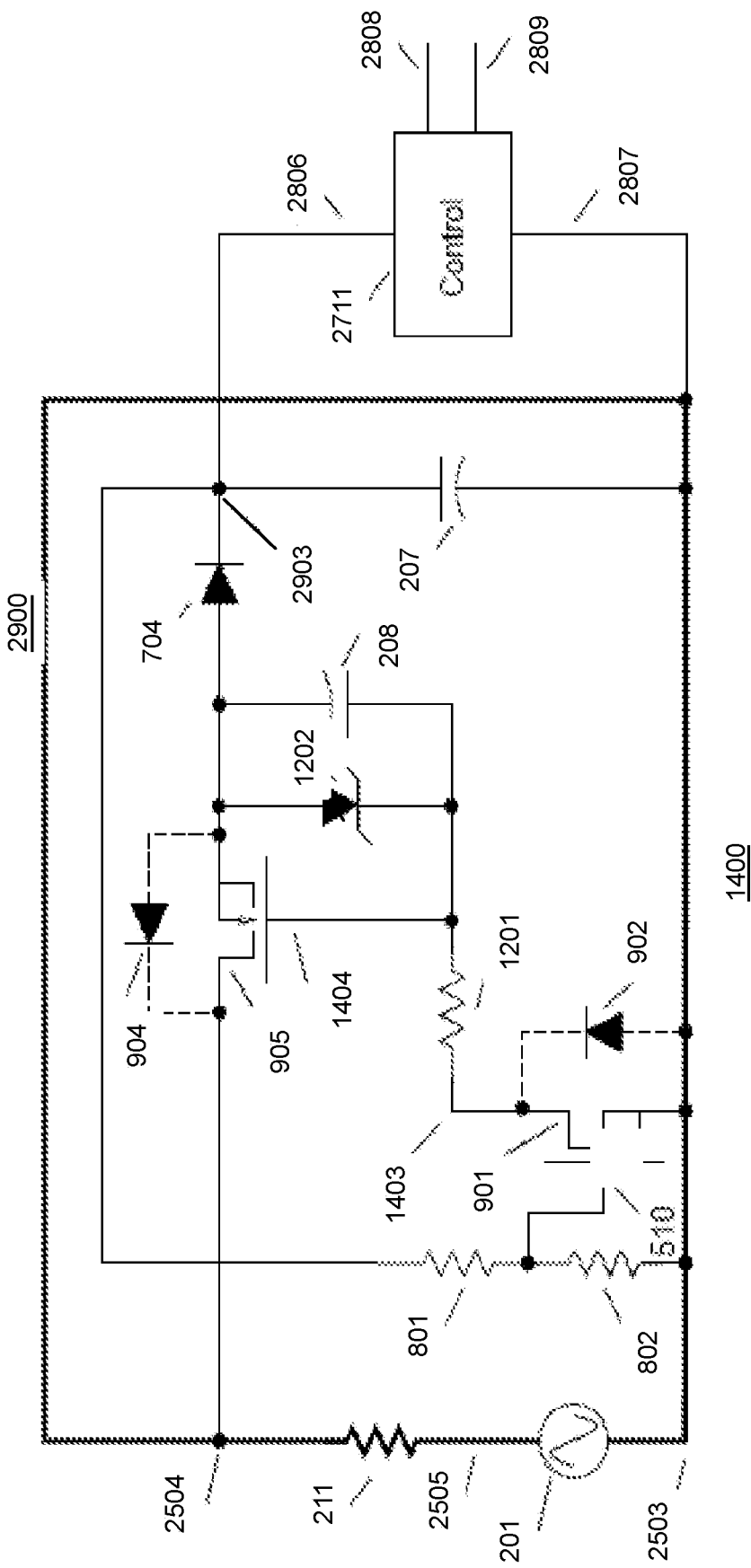
FIG. 31 shows effective configuration of the circuit of FIG. 29 when the MOSFETs in the bidirectional switch are "on".

FIG. 31 shows effective configuration of the circuit of FIG. 29 when the MOSFETs in the bidirectional switch are "on". The AC/DC power supply circuit is bypassed and all current flows from AC mains 201 through load 211.

Figure 32:
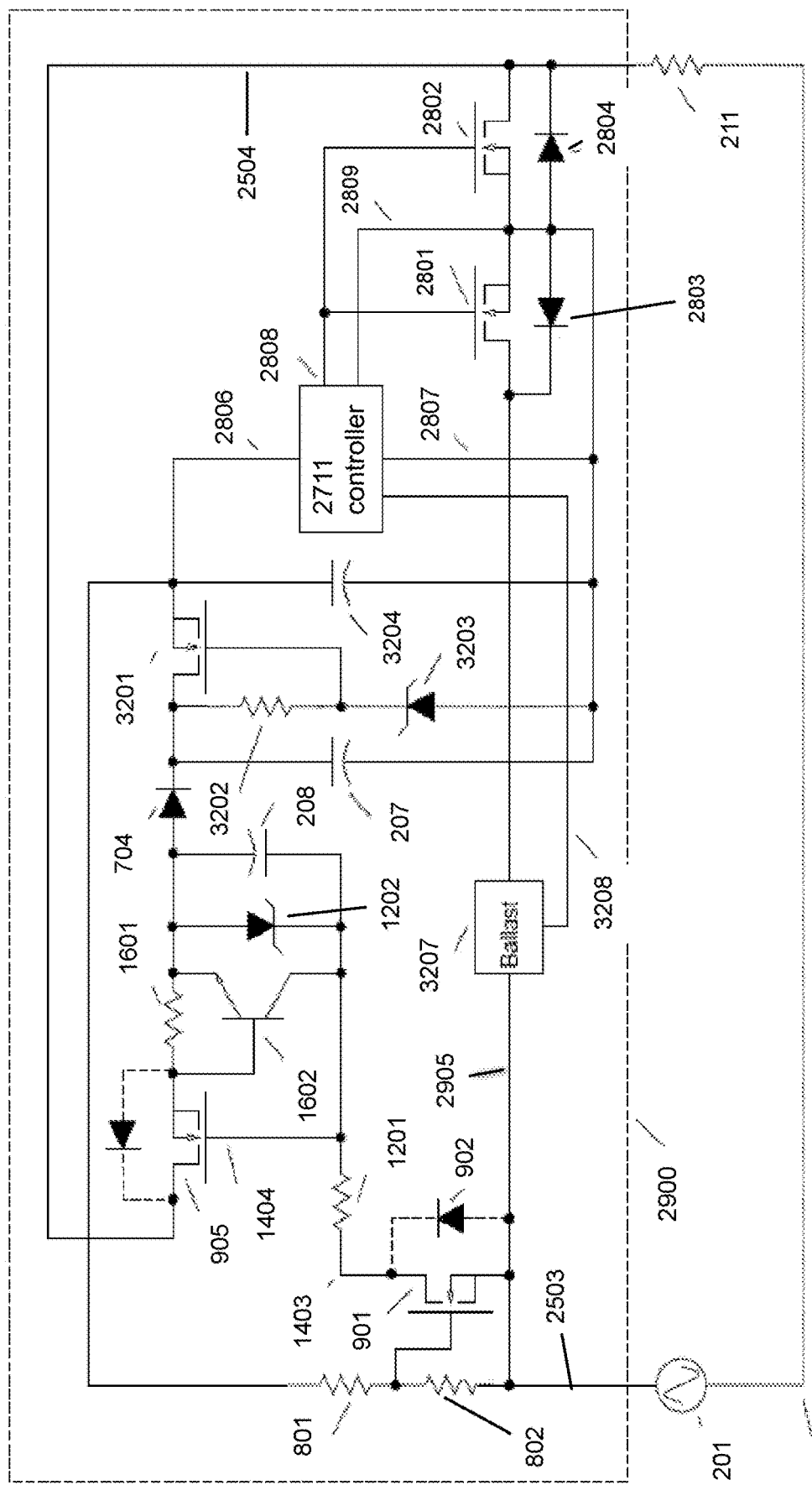
FIG. 32 shows the circuit of FIG. 29 with added subcircuits for overcurrent protection and for output DC voltage regulation.

FIG. 32 shows the circuit of FIG. 29 with added subcircuits for overcurrent protection 1601, 1602, for output DC voltage regulation 3201, 3202, 3203, 3204, and providing a ballast 3207 for LED lighting. Current sampling resistor 1601 and npn bipolar transistor 1602 form an overcurrent protection circuit. Resistor 1601 has a very small value (much less than one ohm) determined by the maximum current rating of power MOSFET 905.

When the voltage drop across resistor 1601 exceeds approximately 0.6V (for silicon transistors) bipolar transistor 1602 conducts, connecting the gate of MOSFET 905 to its source and reducing the current. Series pass MOSFET 3201, bias resistor 3202, Zener diode 3203 and filter capacitor 3204 form a simple voltage regulation circuit. The output voltage through lines 2806, 2807 to controller 2711 will be regulated to a value given by the Zener voltage of diode 3203 less the threshold voltage of pass MOSFET 3201. In one embodiment the two-wire switch further includes ballast circuit 3207 that provides additional control of load current. Circuit 3207 is connected in series with switches 2801, 2802. Ballast circuit 3207 is controlled by control circuit 2711, and connected to switch control circuit 2711 through a connection 3208. Connection 3208 may be a wired or wireless connection to the control circuit 2711.

Figure 33:
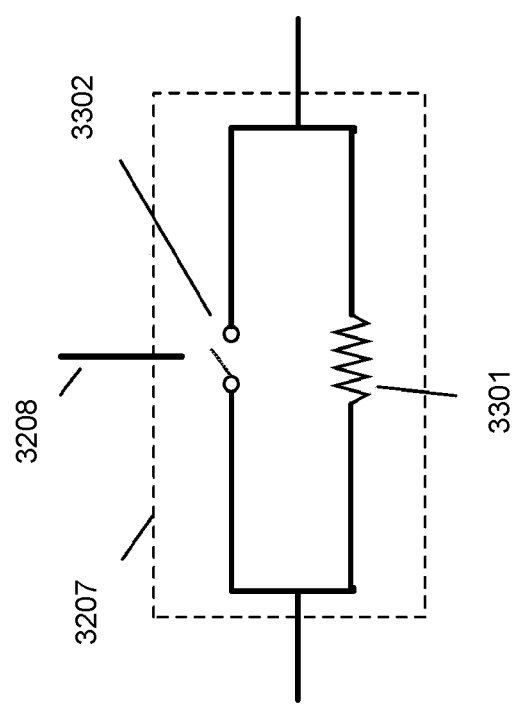
FIG. 33 shows details of a ballast circuit as used in FIG. 32.

In one embodiment, shown in FIG. 33, the ballast circuit 3207 includes a ballast resistor 3301 and switch 3302 wired in parallel. The switch 3302 is controlled through connection 3208 by control circuit 2711. In one embodiment for dimming LED lighting the switch 3302 is normally closed, and, opened when dimming to 0% output such that ballast resistor 3301 reduces current through a connected LED load to less than a threshold required to light the LED. In one embodiment the switch 3302 is a relay switch. In another embodiment control line 3208 is a wireless connection to the control circuit 2711.

Power Supplies

The components described above generally as the AC/DC converter and the bidirectional switch are combined with other components to produce a wide variety of power supplies.

AC Power Microcontroller Unit

Figure 34:
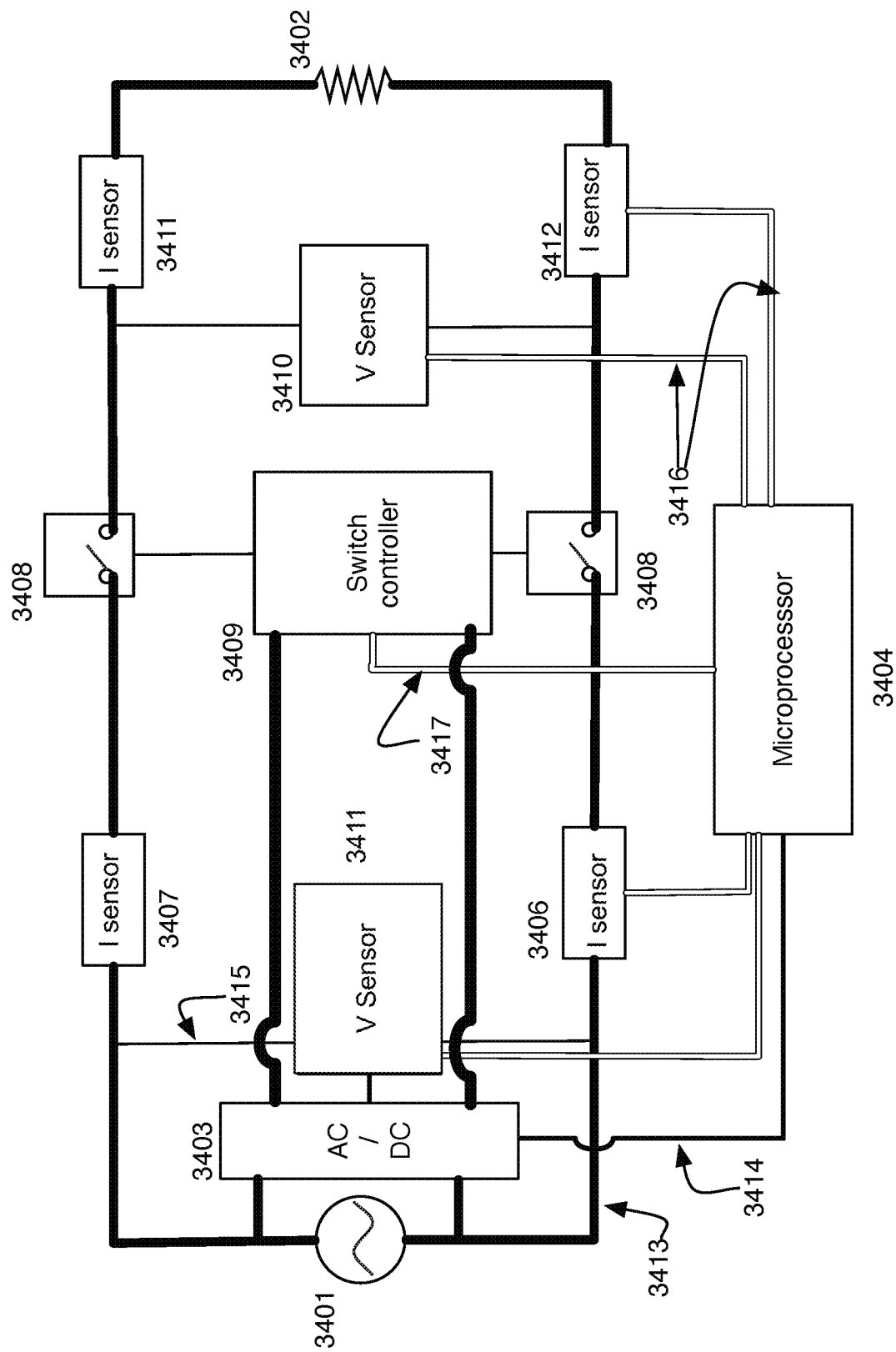
FIG. 34 shows an AC power supply including a microcontroller unit (MCU).

FIG. 34 shows a load identifying AC power supply micro-control unit (MCU) as described in U.S. Pat. No. 11,336,199 that includes common inventors to this application. That patent did not include improvements described herein at least to both the AC/DC converter and bidirectional switch as discussed above. The AC mains 3401 is connected to the load 3402 through the load identifying AC power supply 3403-3416. The connecting lines in the Figure are shown as bold lines 3413 representing power connections lighter lines 3414 representing sense line connections and double lines 3416 representing data acquisition 3416 and control line 3417 connections. A bidirectional switch 3408 is located in both the line and neutral arms between the source 3401 and the load 3402. The load identifying AC power supply includes an AC to DC converter 3403 that supplies power to the current 3406, 3407, 3411, 3412 and voltage 3405, 3410 sensors that acquire the AC mains data and the load data. The AC/DC converter also supplies power to a microprocessor 3404. Details of the AC/DC converter in a preferred embodiment are as shown and discussed in conjunction with FIGS. 6 and 7 below. The voltage and current sensors are as those known in the art and include voltage sensors using resistive dividers and current sensors including current-sensing resistor, and current amplifier, and Hall Effect sensors. The sampling results are typically processed by comparators, analog to digital converters (ADC) and stored in data storage elements that include random access memory, read only memory and other solid state memory and non-solid state memory devices as are known in the art. The Microprocessor includes components known in the art and associated with microprocessors including user interfaces to allow actuation and programming of the microprocessor, memory for storage of data and input and output ports for receiving data and sending control signals respectively. In one embodiment the input/output ports include means to access other computing devices such as handheld computing devices and remote servers. All components except perhaps the capacitors shown in the AC/DC converter are integrated onto a single chip. The load 3402 is any sort of load that requires AC power as supplied and can be an unknown load such as might appear connected to a general purpose outlet. The microprocessor 3404 controls both switches through switch controller 3409. The microprocessor can be programmed to provide simple on/off power to the load or the switches 3408 can be actuated in synchronization with the AC power source 3401 to provide a phase control of power to the load 3402 such as might be used to dim lights, provide motor speed control, etc. In a preferred embodiment the AC/DC converter 3403 is the AC/DC converter 1400 as shown in FIG. 29 and the bidirectional switches are both those switches 2901 from FIG. 29 and the switch controller is switch controller 2711 from FIG. 29.

DC Power Microcontroller Unit

Figure 35:
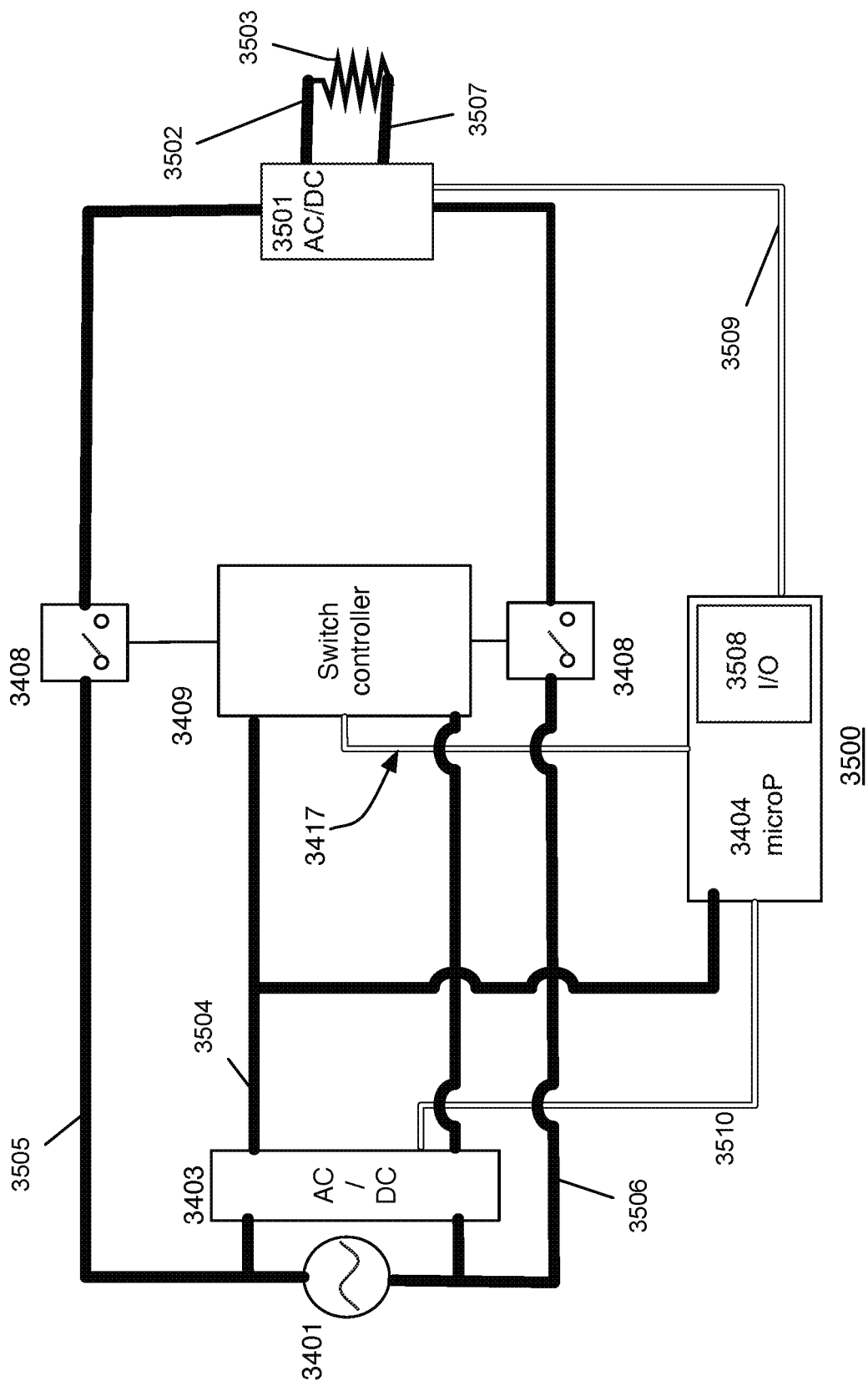
FIG. 35 shows a DC power supply including a MCU.

FIG. 35 shows a DC power supply MCU. In the embodiment shown the load 3402 of FIG. 34 is here a second AC/DC converter 3501 with DC outputs 3502 that would connect to a DC load 3503. The switch controller 3409 and the microprocessor are powered by a first AC/DC converter 3403. The microprocessor includes control lines 3510, 3417, 3509 that send control signals to the first AC to DC 3403, the switch controller 3409, and, the second AC to DC converter 3501 respectively. The control signals to the first AC to DC include setting the output voltage of the first AC to DC converter as required by the switch controller and the microprocessor 3403. The control signals to the switch controller includes turning power off and on to the second AC to DC converter 3501. The control signal to the second AC to DC converter 3501 includes setting the output voltage to the load 3503. In another embodiment, the microprocessor includes an I/O port 3508 and the microprocessor control signals to the first AC to DC converter, the switch controller and the second AC to DC converter are determined by an external control signal received by the I/O port.

In one embodiment the switch controller 3409 is operated in an on/off mode. In one embodiment the second AC/DC converter 3501 is the AC/DC converter as shown in FIG. 29. In another embodiment the second AC/DC converter is the AC/DC converter 1700 as shown in FIG. 17. This second AC/DC converter has a fixed output and a voltage regulator circuit. The Components are chosen to provide the desired output to the load 3503. In one embodiment the output voltages are selected as commonly required of digital electronics such as 3.3 volts or 5 volts.

In another embodiment the second AC/DC converter 3501 is the AC/DC converter 1800 as shown in FIG. 18. This second AC/DC converter is modified by including a potentiometer such that the out voltage may be varied. In one embodiment the microprocessor is programmed to control the potentiometer and thereby sets the output voltage to the load 3503. In another embodiment the microprocessor includes an I/O port 3508 that is connected by wired or wireless means to an external control signal and the external control signal sets parameters for the microprocessor control of the potentiometer such that the output voltage to the load (3503) is set by the external control signal.

In another embodiment the second AC/DC converter 3501 is the AC/DC converter 1900 as shown in FIG. 19. The reference voltage (VC) applied across the gate to source of added transistor 1901 is selected by the microprocessor 3404 thereby electronically determining the output voltage to the load 3503. In one embodiment the microprocessor includes an Input/output (I/O) port (3508) that is wired or wirelessly connected to an external control signal such that the output to the load (3503), including the voltage level as well as simply whether on or off is set by the external control signal.

In one embodiment, multiple power supply units providing AC (FIG. 34) that is both switched and phase modulated, and, DC power (FIG. 35) that is both fixed at pre-selected values, selectable through a potentiometer and programmable, to a variety of loads that may be on the same MCU or separate.

Embodiments for both DC and AC power supplies are described.

DC power supplies include:
1. Fixed voltage DC power supply 1400 (FIG. 14) connected directly to AC mains
2. Fixed voltage DC power supply 1600 (FIG. 16) further including current limit
3. Fixed voltage DC power supply 1700 (FIG. 17) further including voltage regulator and current limit.
4. Variable voltage DC power supply 1800 (FIG. 18) where output voltage is controlled by potentiometer.
5. Variable voltage DC power supply 1900 (FIG. 19) where output voltage is controlled by external (to the power supply) reference voltage source (VC through MOSFET 1901).
6. Switched DC power supply 3500 (FIG. 35) using any of the above mentioned DC supplies and power to the AC/DC output supply 3501 is controlled through switches 3408.

AC power supplies include:
1. Three wire AC power supply 2800 (FIG. 28).
2. Two wire AC power supply 2900 (FIG. 29).

Embodiments of both the DC power supplies and the AC power supplies include current and voltage sensing as shown in FIG. 34. Embodiments of the power supplies include the current limiting of the DC supply 1600 and the added voltage regulator of DC supply 1700.

Figure 36:
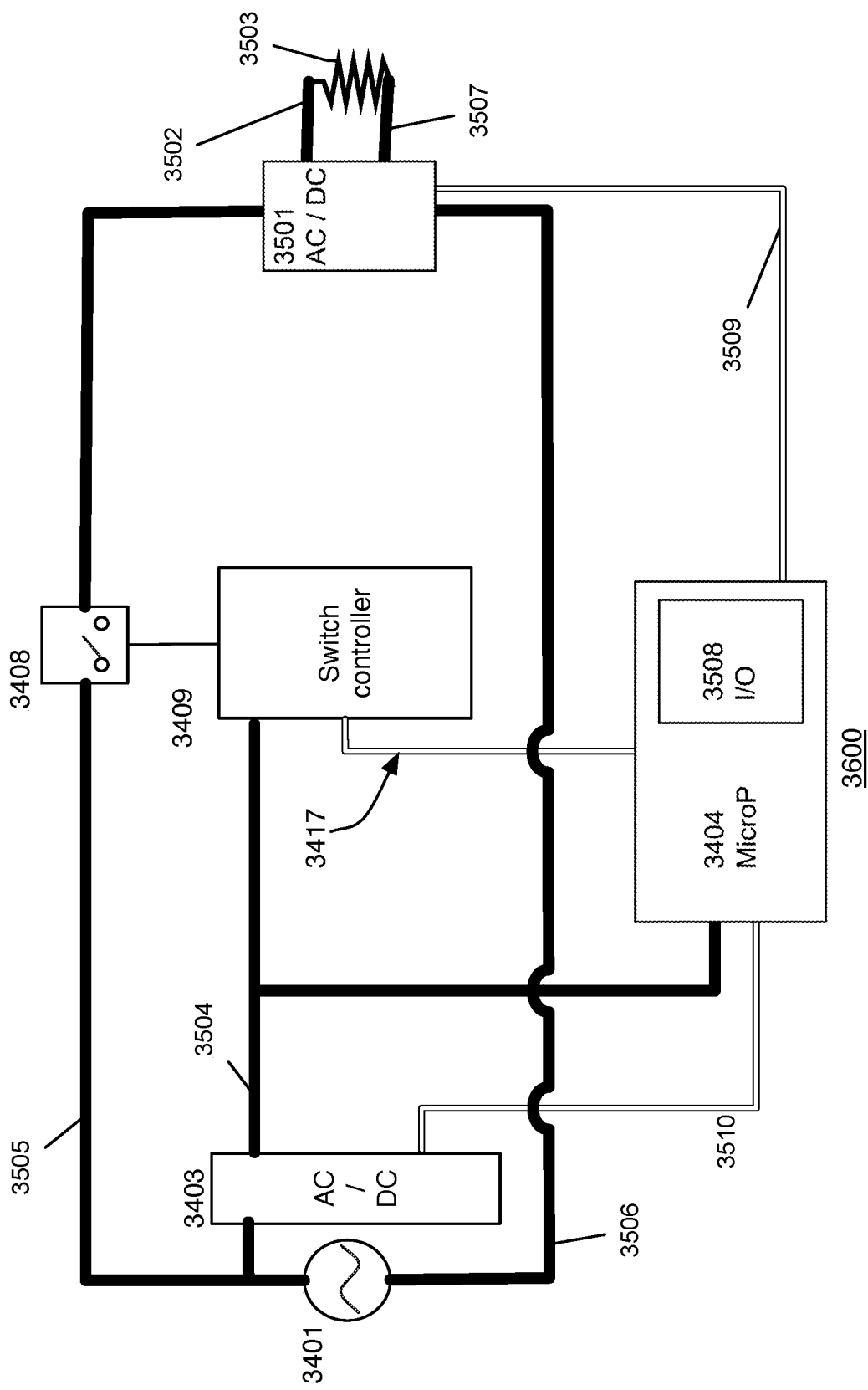
FIG. 36 shows a two-wire version of the DC power supply of FIG. 35.

In another embodiment of the DC power supply 3600 shown in FIG. 36, the AC to DC converter 3403, the microprocessor 3404, a single bidirectional switch 3408, the switch controller and the second AC to DC converter 3501 are all connected as a two-wire system in a single side, here shown in the hot line 3505, of the AC supply 3401. Circuit details of this configuration are as already shown and discussed in FIG. 32.

SUMMARY

Both AC and DC Power supply systems that may be connected directly to. AC mains and are integrated on silicon are described. The AC systems include both simple on/off capabilities as well as phase control capabilities. The DC power supply may be fixed, adjustable as through a potentiometer and programmable. The power supply systems use newly invented components of AC/DC converters and bidirectional MOSFET switches.

I claim:

1. A power supply system for providing energy from an alternating current (AC) power source in a direct current (DC) to an electronic load, the power supply system comprising:
   a. a first AC to DC converter connected to the AC power source that supplies power through a first AC to DC output to a switch controller and a microprocessor, and,
   b. bidirectional switches located in a hot line and a neutral line from the AC power source, the bidirectional switches controlled by the switch controller, and,
   c. a second AC to DC converter connected to the AC power source through the bidirectional switches, the second AC to DC converter having DC output lines connected to the electronic load, and,
   d. the first AC to DC converter comprising:
      i. a voltage divider connected across the first AC to DC output and the neutral line, and,
      ii. a first switch, having an input and an output, connected through its input to the voltage divider, and,
      iii. a second switch, having an input and an output, whose input is connected to the output of the first switch through a current limiting resistor, and,
      iv. a storage capacitor connected through a diode to the output of the second switch, and,
      v. a Zener diode, having a Zener voltage, connected between the input and output of the second switch and a shunt capacitor connected in parallel to the Zener diode thereby clamping a voltage between the input and the output of the second switch to the Zener voltage of the Zener diode, and,
      vi. the first AC to DC output connected to the storage capacitor, and,
   e. the second AC to DC converter comprising:
      i. a second AC to DC converter voltage divider connected across one of the DC output lines and the neutral line, and,
      ii. a second AC to DC converter first switch, having an input and an output, connected through its input to the second AC to DC converter voltage divider, and,
      iii. a second AC to DC converter second switch, having an input and an output, whose input is connected to the output of the second AC to DC converter first switch through a current limiting resistor, and,
      iv. a second AC to DC converter storage capacitor connected through a diode to the output of the second AC to DC converter second switch, and,
      v. a second AC to DC converter Zener diode, having a Zener voltage, connected between the input and output of the second AC to DC converter second switch and a shunt capacitor connected in parallel to the second AC to DC converter Zener diode thereby clamping a voltage between the input and the output of the second AC to DC converter second switch to the Zener voltage of the second AC to DC converter Zener diode, and,
      vi. the one of the DC output lines connected to the second AC to DC converter storage capacitor, and,
   f. the microprocessor is programmed to send a signal through a control line to the switch controller to open or close the bidirectional switches thereby turning off or on DC current to the electronic load.

2. The power supply system of claim 1, wherein the first AC to DC converter, the bidirectional switches, the switch controller, the microprocessor, and the second AC to DC converter are all integrated on a same silicon chip.

3. The power supply system of claim 1 wherein the second AC to DC converter voltage divider includes a potentiometer, the potentiometer controlled by the microprocessor such that an output voltage of the second AC to DC converter to the electronic load is controlled by the microprocessor.

4. The power supply system of claim 3 wherein the microprocessor further includes an input/output port and the microprocessor receives an external control signal through the input/output port and the microprocessor is further programmed to control the potentiometer and thereby control the output voltage of the second AC to DC converter to the electronic load based upon the external control signal.

5. The power supply system of claim 1 wherein the second AC to DC converter voltage divider includes a voltage control transistor and an output voltage of the second AC to DC converter is controlled by a reference voltage applied across a gate to source of the voltage control transistor and supplied through a control line by the microprocessor such that the output voltage of the second AC to DC converter to the electronic load is controlled by the microprocessor.

6. The power supply system of claim 5 wherein the microprocessor further includes an input/output port and the microprocessor receives an external control signal through the input/output port and the microprocessor is further programmed to send the reference voltage, and thereby control the output voltage of the second AC to DC converter to the electronic load, based upon the external control signal.

* * * * *